US012557490B2

(12) United States Patent
Oh et al.

(10) Patent No.: US 12,557,490 B2
(45) Date of Patent: Feb. 17, 2026

(54) DISPLAY DEVICE

(71) Applicant: Samsung Display Co., Ltd., Yongin-Si (KR)

(72) Inventors: Youngtaek Oh, Yongin-si (KR); Jinsung An, Yongin-si (KR); Sungho Kim, Yongin-si (KR); Yongjae Kim, Yongin-si (KR); Sugwoo Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 426 days.

(21) Appl. No.: 18/216,594

(22) Filed: Jun. 30, 2023

(65) Prior Publication Data
US 2024/0224626 A1 Jul. 4, 2024

(30) Foreign Application Priority Data
Jan. 4, 2023 (KR) .................. 10-2023-0001059

(51) Int. Cl.
*H10K 59/126* (2023.01)
*H10K 59/124* (2023.01)
*H10K 59/131* (2023.01)

(52) U.S. Cl.
CPC ......... *H10K 59/126* (2023.02); *H10K 59/124* (2023.02); *H10K 59/131* (2023.02)

(58) Field of Classification Search
None
See application file for complete search history.

(56) References Cited

U.S. PATENT DOCUMENTS

| 10,861,393 B2 | 12/2020 | Kim et al. |
| 2008/0088788 A1* | 4/2008 | Cho .................. G02F 1/136213 438/30 |
| 2021/0233971 A1* | 7/2021 | Yuan ..................... H10K 59/131 |
| 2024/0008309 A1* | 1/2024 | Park ....................... G06F 3/0412 |

FOREIGN PATENT DOCUMENTS

| CN | 112864032 A | 5/2021 |
| JP | 2001-125510 A | 5/2001 |
| KR | 10-0659756 B1 | 12/2006 |

* cited by examiner

*Primary Examiner* — William C Trapanese
(74) *Attorney, Agent, or Firm* — Innovation Counsel LLP

(57) ABSTRACT

A display device includes a substrate, an active pattern, a first conductive layer, a second conductive layer, a shielding pattern, and a light emitting element. The active pattern is disposed on the substrate. The active pattern includes a first region, a second region, and a first channel region. The first conductive layer is disposed on the active pattern. The first conductive layer includes a first gate electrode overlapping the first channel region. The second conductive layer is disposed on the first conductive layer. The second conductive layer includes a first storage electrode overlapping the second region. The shielding pattern disposed on the second conductive layer. The shielding pattern overlaps the first gate electrode and the first storage electrode, and includes a black material. The light emitting element is disposed on the shielding pattern. Accordingly, low frequency characteristics of the display device may be improved.

20 Claims, 27 Drawing Sheets

T3: T3-1, T3-2
T4: T4-1, T4-2

DISPLAY DEVICE

CROSS-REFERENCE TO RELATED APPLICATION(S)

The present application claims priority to and the benefit of Korean Patent Application No. 10-2023-0001059 filed on Jan. 4, 2023, in the Korean Intellectual Property Office (KIPO), the entire disclosure of which is incorporated herein by reference.

BACKGROUND

1. Field

Embodiments relate to a display device. More particularly, embodiments relate to a display device including a oxide semiconductor.

2. DESCRIPTION OF THE RELATED ART

Recently, a demand for a technology for reducing power consumption of a display device is increasing. Accordingly, a low-frequency driving scheme for driving the display device at a relatively low frequency has been researched.

According to the low-frequency driving scheme, a leakage current of a pixel circuit may be increased. Accordingly, a pixel luminance difference between consecutive frames may occur.

SUMMARY

Embodiments provide a display device improving low-frequency driving characteristics.

A display device according to an embodiment of the disclosure includes a substrate, an active pattern disposed on the substrate, and including a first region, a second region, and a first channel region, a first conductive layer disposed on the active pattern and including a first gate electrode overlapping the first channel region, a second conductive layer disposed on the first conductive layer, and including a first storage electrode overlapping the second region, a shielding pattern disposed on the second conductive layer, overlapping the first gate electrode and the first storage electrode, and including a black material, and a light emitting element disposed on the shielding pattern.

In an embodiment, the display device may further include an interlayer insulating layer disposed on the second conductive layer and a first via insulating layer disposed between the interlayer insulating layer and the light emitting element.

In an embodiment, the first via insulating layer may cover the shielding pattern.

In an embodiment, the display device may further include a via formed through in the first via insulating layer. The shielding pattern may include a first shielding pattern disposed adjacent to the via hole and a second shielding pattern disposed to be spaced apart from the first shielding pattern and having a shape that is different from a shape of the first shielding pattern in a plan view.

In an embodiment, the display device may further include an interlayer insulating layer disposed on the second conductive layer, a first via insulating layer disposed on the interlayer insulating layer, and a second via insulating layer disposed between the first via insulating layer and the light emitting element. The second via insulating layer may cover the shielding pattern.

In an embodiment, the display device may further include a via hole formed through the second via insulating layer. The shielding pattern may include a first shielding pattern disposed adjacent to the via hole. The second shielding pattern may be disposed to be spaced apart from the first shielding pattern, and may have a shape that is different from a shape of the first shielding pattern in a plan view.

In an embodiment, the display device may further include an interlayer insulating layer disposed on the second conductive layer, a first via insulating layer disposed on the interlayer insulating layer, a second via insulating layer disposed on the first via insulating layer, and a third via insulating layer disposed between the second via insulating layer and the light emitting element. The third via insulating layer may cover the shielding pattern.

In an embodiment, the display device may further include a hole formed through in the third via insulating layer. The shielding pattern may include a first shielding pattern disposed adjacent to the hole and a second shielding pattern disposed to be spaced apart from the first shielding pattern, and having a shape that is different from a shape of the first shielding pattern in a plan view.

In an embodiment, the first gate electrode may constitute a driving initialization transistor together with the first region, the second region, and the first channel region of the active pattern.

In an embodiment, the active pattern may further include a fourth region, a fifth region, a third channel region, and a fourth channel region.

In an embodiment, the first conductive layer may further include second gate electrodes disposed on the active pattern, and overlapping the third channel region and the fourth channel region, respectively, and the shielding pattern overlaps the second gate electrodes.

In an embodiment, the second conductive layer may further include a second storage electrode disposed on the first conductive layer, and overlapping the fourth region, and the shielding pattern overlaps the second storage electrode.

In an embodiment, the second gate electrodes may constitute a diode transistor together with the third region, the fourth region, the fifth region, the third channel region, and the fourth channel region of the active pattern.

A display device according to an embodiment of the disclosure includes a substrate, an active pattern disposed on the substrate, and including a first region, a second region, a third region, a fourth region, a fifth region, a first channel region, a second channel region, a third channel region, and a fourth channel region, a first conductive layer disposed on the active pattern, and including first gate electrodes overlapping the first channel region and the second channel region, respectively, and second gate electrodes overlapping the third channel region and the fourth channel region, respectively, a second conductive layer disposed on the first conductive layer, and including a first storage electrode overlapping the second region and a second storage electrode overlapping the fourth region, an electrode pattern disposed on the second conductive layer, and connected to the third region of the active pattern, a shielding pattern disposed on the second conductive layer, overlapping the first gate electrodes, the second gate electrodes, the first storage electrode, and the second storage electrode, and including a black material, and a light emitting element disposed on the shielding pattern.

In an embodiment, the display device may further include an interlayer insulating layer disposed on the second conductive layer, and a first via insulating layer may be disposed between the interlayer insulating layer and the light emitting element.

In an embodiment, the first via insulating layer may cover the shielding pattern and the electrode pattern, and include a via hole formed through in the first via insulating layer, and the shielding pattern may include a first shielding pattern disposed adjacent to the hole and a second shielding pattern disposed to be spaced apart from the first shielding pattern, and having a shape that is different from a shape of the first shielding pattern in a plan view.

In an embodiment, the display device may further include a second via insulating layer disposed between the first via insulating layer and the light emitting element, and the second via insulating layer may cover the shielding pattern and include a via hole formed through the second via insulating layer, and the shielding pattern may include a first shielding pattern disposed adjacent to the hole and a second shielding pattern disposed to be spaced apart from the first shielding pattern, and having a shape that is different from a shape of the first shielding pattern in a plan view.

In an embodiment, the display device may further include a second via insulating layer disposed on the first via insulating layer; and a third via insulating layer disposed between the second via insulating layer and the light emitting element. The third via insulating layer may cover the shielding pattern, and includes a hole formed through the third via insulating layer. The shielding pattern may include a first shielding pattern disposed adjacent to the via hole and a second shielding pattern disposed to be spaced apart from the first shielding pattern, and having a shape that is different from a shape of the first shielding pattern in a plan view.

In an embodiment, the first gate electrodes may constitute a driving initialization transistor together with the first region, the second region, the third region, the first channel region, and the second channel region of the active pattern.

In an embodiment, the second gate electrodes may constitute a diode transistor together with the third region, the fourth region, the fifth region, the third channel region, and the fourth channel region of the active pattern.

DETAILED DESCRIPTION OF THE EMBODIMENTS

Figure 1:
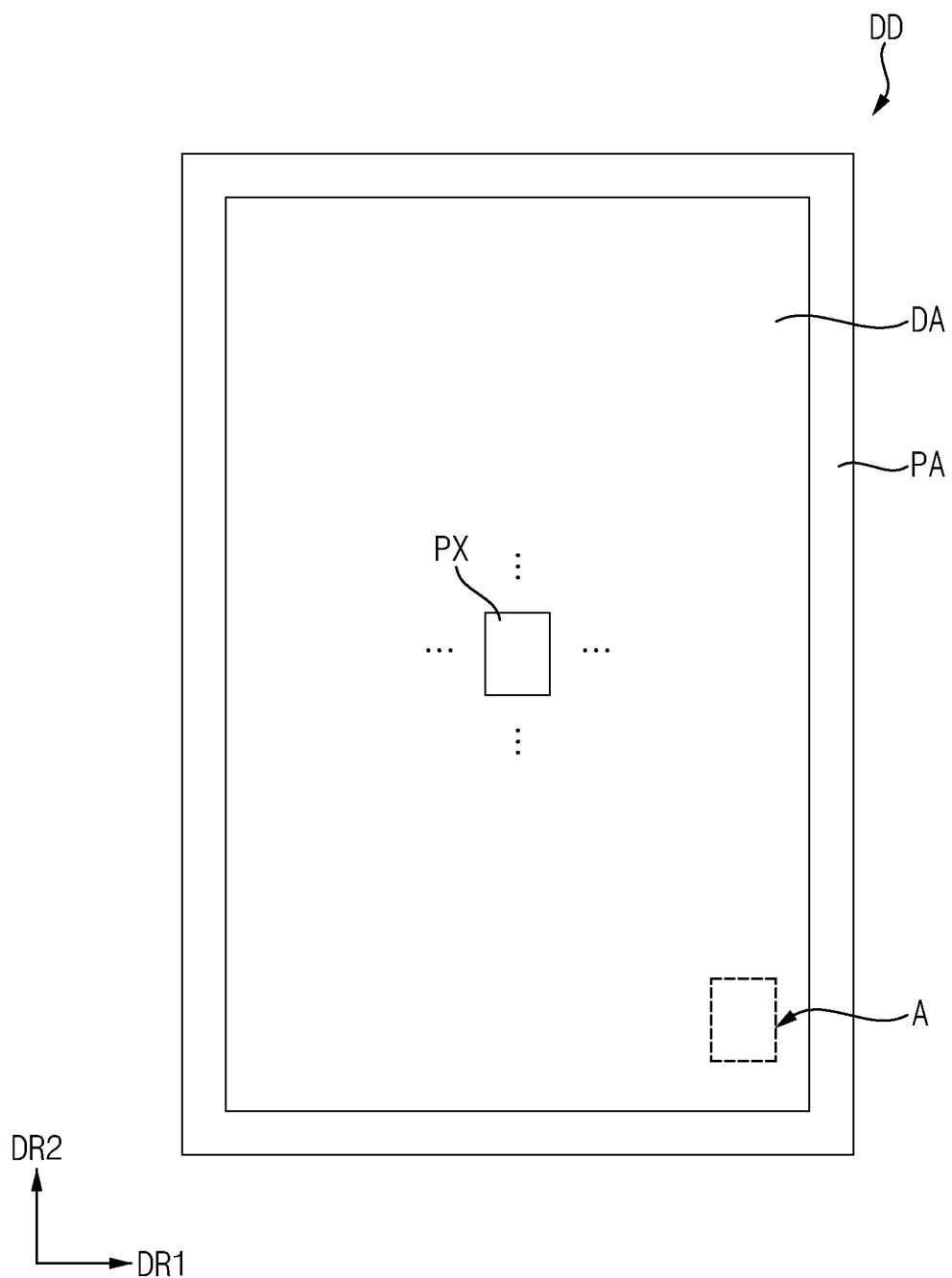
FIG. 1 is a plan view illustrating a display device according to an embodiment of the disclosure.

Hereinafter, embodiments will be described in more detail with reference to the accompanying drawings. The same reference numerals are used for the same components in the drawings, and redundant descriptions of the same components will be omitted.

FIG. 1 is a plan view illustrating a display device according to an embodiment of the disclosure.

Referring to FIG. 1, a display device DD according to an embodiment of the disclosure may include a display area DA and a peripheral area PA. The display area DA may be defined as an area capable of displaying an image by generating light or adjusting transmittance of light provided from an external light source. The peripheral area PA may be defined as an area not displaying the image. In addition, the peripheral area PA may surround at least a portion of the display area DA. For example, the peripheral area PA may entirely surround the display area DA.

A plurality of pixels PX may be disposed in the display area DA. For example, each of the plurality of pixels PX may include a driving element and a light emitting element.

The plurality of pixels PX may be arranged in a matrix form along a first direction DR1 and a second direction DR2 crossing the first direction DR1. For example, the first direction DR1 and the second direction DR2 may be orthogonal.

A driver for driving the plurality of pixels PX may be disposed in the peripheral area PA. For example, the driver may include a data driver, a gate driver, a light emitting driver, a power voltage generator, a timing controller, and the like. The plurality of pixels PX may emit light based on signals transmitted from the drivers.

Figure 2:
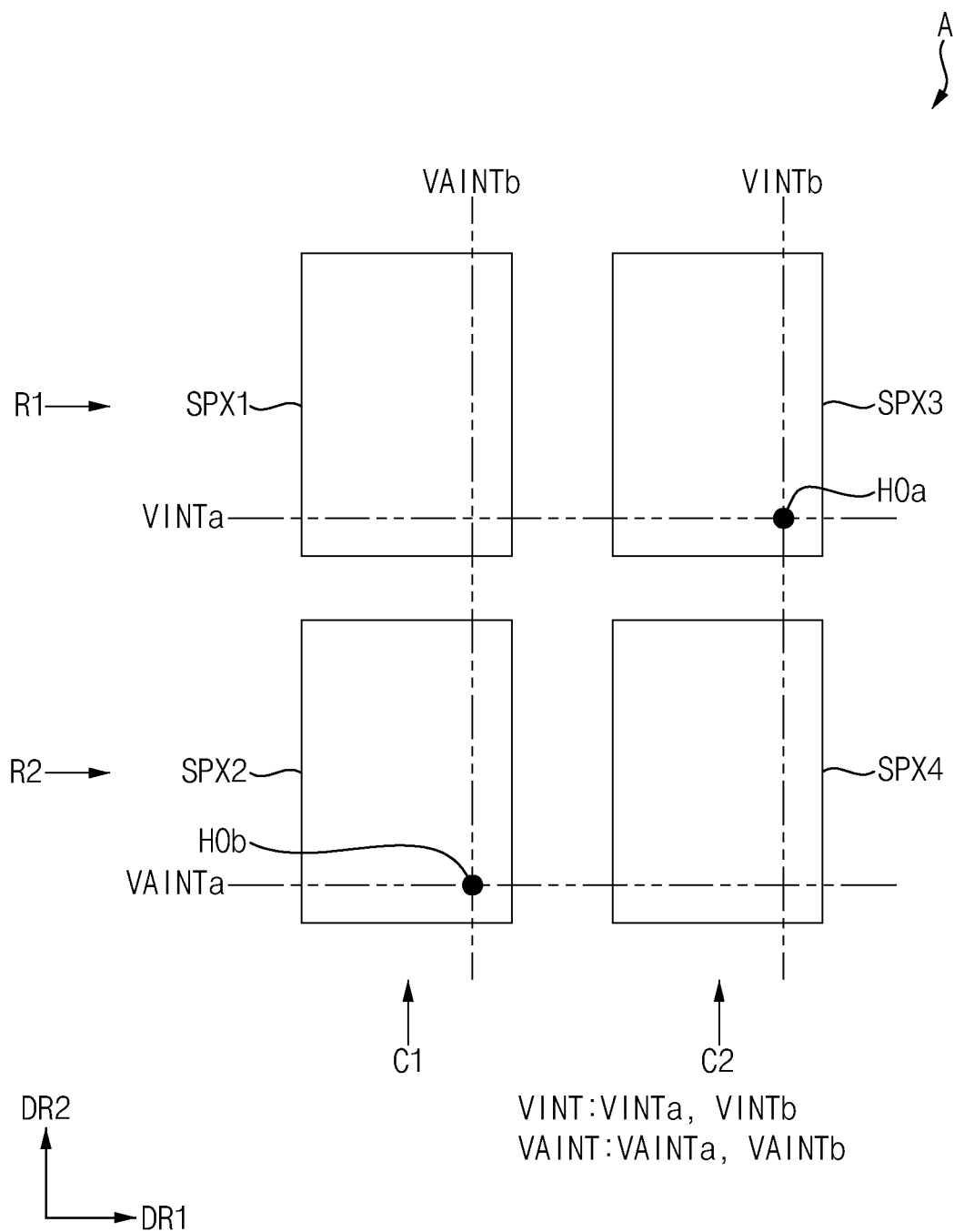
FIG. 2 is an enlarged plan view of area A of FIG. 1.

FIG. 2 is an enlarged plan view of area A of FIG. 1.

For example, FIG. 2 is a view illustrating a plurality of sub-pixels SPX1, SPX2, SPX3, and SPX4 included in each of the plurality of pixels PX of FIG. 1.

Referring to FIGS. 1 and 2, the plurality of pixels PX may include a first sub-pixel SPX1, a second sub-pixel SPX2, a third sub-pixel SPX3, and a fourth sub-pixel SPX4.

The first sub-pixel SPX1 and the second sub-pixel SPX2 may be disposed along a first column C1. The third sub-pixel SPX3 and the fourth sub-pixel SPX4 may be disposed along a second column C2. The second column C2 may be adjacent to the first column C1.

In addition, the first sub-pixel SPX1 and the third sub-pixel SPX3 may be disposed along a first row R1. The second sub-pixel SPX2 and the fourth sub-pixel SPX4 may be disposed along a second row R2. The second row R2 may be adjacent to the first row R1.

In this way, an arrangement of the sub-pixels may be repeated up to predetermined rows and columns. For example, the first sub-pixel SPX1 and the second sub-pixel SPX2 may be arranged along odd-numbered columns, and the third sub-pixel SPX3 and fourth sub-pixel SPX4 may be arranged along even-numbered columns. In addition, the first sub-pixel SPX1 and the third sub-pixel SPX3 may be arranged along odd-numbered rows, and the second sub-pixel SPX2 and fourth sub-pixel SPX4 may be arranged along even-numbered rows.

Each of the first sub-pixel SPX1, the second sub-pixel SPX2, the third sub-pixel SPX3, and the fourth sub-pixel SPX4 may connect to voltage initialization lines. The voltage initialization lines may include a first voltage initialization line VINT and the second voltage initialization line VAINT. As the first voltage initialization line VINT and the second voltage initialization line VAINT have a separated structure, color deviation may be improved at low luminance.

The voltage initialization lines may have a mesh structure in a plan view. The first voltage initialization line VINT may include a horizontal part VINTa extending in the first direction DR1 and a vertical part VINTb extending in the second direction DR2. The second voltage initialization line VAINT may also include a horizontal part VAINTa extending in the first direction DR1 and a vertical part VAINTb extending in the second direction DR2.

The voltage initialization lines extending parallel to the first direction DR1 may be alternately arranged in the second direction DR2. For example, each of the first sub-pixel SPX1 and the third sub-pixel SPX3 may be connected to the first voltage initialization line VINT. Each of the second sub-pixel SPX2 and the fourth sub-pixel SPX4 may be connected to the second voltage initialization line VAINT.

The voltage initialization lines may be electrically connected to the sub-pixels through via holes HOa and HOb. For example, the first sub-pixel SPX1 located in the first row R1 may overlap only the horizontal part VINTa of the first voltage initialization line VINT. The second voltage initialization line VAINT may be located on the second row R2. Accordingly, the first sub-pixel SPX1 may not overlap the horizontal part VAINTa of the second voltage initialization line VAINT. On the other hand, the second sub-pixel SPX2 located in the second row R2 may overlap only the horizontal part VAINTa of the second voltage initialization line VAINT. Accordingly, the second sub-pixel SPX2 may not overlap the horizontal part VINTa of the first voltage initialization line VINT. However, since the via holes HOa and HOb are formed, the first sub-pixel SPX1 may receive a second initialization voltage from the second voltage initialization line VAINT through a connection line, and the second sub-pixel SPX2 may receive a first initialization voltage from the first voltage initialization line VINT through a connection line.

Although each of the plurality of pixels PX has been shown in FIG. 2 as being provided with the voltage initialization lines, however, the disclosure is not limited thereto. For example, the voltage initialization lines may be shared with pixels adjacent to each of the pixels PX.

Figure 3:
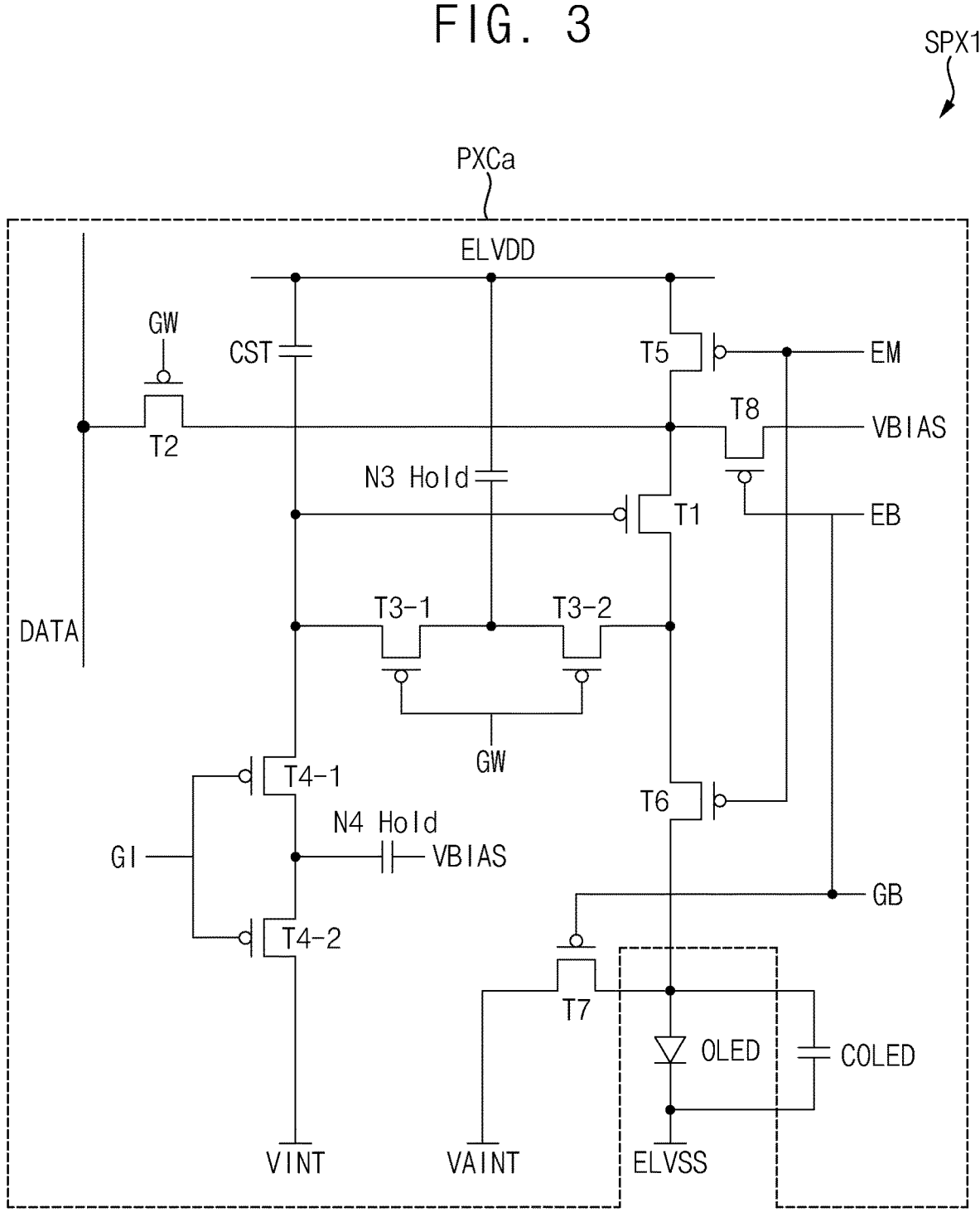
FIG. 3 is a circuit view illustrating the sub-pixel included in the pixel of FIG. 2.

FIG. 3 is a circuit view illustrating each sub-pixel included in the pixel of FIG. 2.

Referring to FIGS. 1, 2, and 3, the first sub-pixel SPX1 may include a light emitting element OLED and a pixel circuit PXCa. The pixel circuit PXCa may provide a driving current to the light emitting element OLED and the light emitting element OLED may generate a light based on the driving current.

The light emitting element OLED may be electrically connected to the pixel circuit PXCa. The light emitting element OLED may receive the driving current from the pixel circuit PXCa so as to generate the light. For example, the light emitting element OLED may be an organic light emitting diode.

The pixel circuit PXCa may include a first transistor T1, a second transistor T2, a third transistor T3, a fourth transistor T4, a fifth transistor T5, a sixth transistor T6, a seventh transistor T7, and an eighth transistor T8.

A first terminal of the first transistor T1 may be connected to a data voltage line DATA via a second transistor T2 and a first power supply voltage line ELVDD via the fifth transistor T5. A second terminal of the first transistor T1 may be connected to the light emitting element OLED. A gate terminal of the first transistor T1 may be connected to a storage capacitor CST.

A first terminal of the second transistor T2 may be connected to the data voltage line DATA. A second terminal of the second transistor T2 may be connected to the first terminal of the first transistor T1. A gate terminal of the second transistor T2 may be connected to a first gate signal line GW.

The third transistor T3 may include a first sub-transistor T3-1 and a second sub-transistor T3-2 which are serially connected to each other. A first terminal of the first sub-transistor T3-1 may be connected to a second terminal of the second sub-transistor T3-2. A second terminal of the first sub-transistor T3-1 may be connected to the gate terminal of the first transistor T1. A first terminal of the second sub-transistor T3-2 may be connected to the second terminal of the first transistor T1. The second terminal of the second sub-transistor T3-2 may be connected to the first terminal of the first sub-transistor T3-1. Each of a gate terminal of the first sub-transistor T3-1 and a gate terminal of the second sub-transistor T3-2 may be connected to the first gate signal line GW.

The fourth transistor T4 may include a third sub-transistor T4-1 and a fourth sub-transistor T4-2 which are serially connected to each other. A first terminal of the third sub-transistor T4-1 may be connected to a second terminal of the fourth sub-transistor T4-2. A second terminal of the third sub-transistor T4-1 may be connected to the gate terminal of the first transistor T1. A first terminal of the fourth sub-transistor T4-2 may be connected to the first voltage initialization line VINT. The second terminal of the fourth sub-transistor T4-2 may be connected to the first terminal of the third sub-transistor T4-1. Each of a gate terminal of the third sub-transistor T4-1 and a gate terminal of the fourth sub-transistor T4-2 may be connected to a second gate signal line GI.

A first terminal of a fifth transistor T5 may be connected to the first power supply voltage line ELVDD. A second terminal of the fifth transistor T5 may be connected to the first terminal of the first transistor T1. A gate terminal of the fifth transistor T5 may be connected to an emission control line EM.

A first terminal of a sixth transistor T6 may be connected to the second terminal of the first transistor T1. A second terminal of the sixth transistor T6 may be connected to the light emitting element OLED. A gate terminal of the sixth transistor T6 may be connected to the emission control line EM.

A first terminal of a seventh transistor T7 may be connected to the second voltage initialization line VAINT. A second terminal of the seventh transistor T7 may be connected to the light emitting element OLED. A gate terminal of the seventh transistor T7 may be connected to a third gate signal line GB.

A first terminal of an eighth transistor T8 may be connected to a bias voltage line VBIAS. A second terminal of the eighth transistor T8 may be connected to the first terminal of the first transistor T1. A gate terminal of the eighth transistor T8 may be connected to a bias control line EB.

The pixel circuit PXCa may include a storage capacitor CST, two hold capacitors N3 HOLD and N4 HOLD, and a diode parasitic capacitor COLED.

A first terminal of the storage capacitor CST may be connected to the first power supply voltage line ELVDD. A second terminal of the storage capacitor CST may be connected to the gate terminal of the first transistor T1.

A first terminal of a first hold capacitor N3 HOLD may be connected to the first power supply voltage line ELVDD. A second terminal of the first hold capacitor N3 HOLD may be connected to each of the first terminal of the first subtransistor T3-1 and the second terminal of the second sub-transistor T3-2.

A first terminal of a second hold capacitor N4 HOLD may be connected to each of the first terminal of the third sub-transistor T4-1 and the second terminal of the fourth sub-transistor T4-2. A second terminal of the second hold capacitor N4 HOLD may be connected to the bias voltage line VBIAS.

A first terminal of the diode parasitic capacitor COLED may be connected to an anode electrode of the light emitting element OLED. A second terminal of the diode parasitic capacitor COLED may be connected to a cathode electrode of the light emitting element OLED.

Since a circuit structure of the pixel circuit PXCa shown in FIG. 3 has been provided for illustrative purposes, the circuit structure may be variously changed.

FIGS. 4 to 16 are layout views illustrating the display device of FIG. 1.

The display device may include the pixel circuits of the plurality of sub-pixels that are adjacent to each other. The pixel circuits may include substantially a same component. For example, in FIGS. 4 to 16, a first section SEC1 may be a portion of a first sub-pixel (e.g., the first sub-pixel SPX1 of FIG. 2), and a second section SEC2 may be a portion of a second sub-pixel (e.g., the second sub-pixel SPX2 of FIG. 2). Both the first section SEC1 and the second section SEC2 are layout views for describing a shielding pattern (e.g., a shielding pattern BVIA of FIG. 10 and a shielding pattern BVIA of FIG. 16) covering the third transistor T3 and the fourth transistor T4. To this end, the first transistor T1, the second transistor T2, the fifth transistor T5, the sixth transistor T6, the seventh transistor T7, and the eighth transistor T8 have been omitted in the figures, and the figures have focused on the third transistor T3 and the fourth transistor T4. Hereinafter, for convenience of description, the first section SEC1 among components corresponding to one-pixel circuit (e.g., the pixel circuit PXCa of FIG. 3) will be mainly described.

Figure 4:
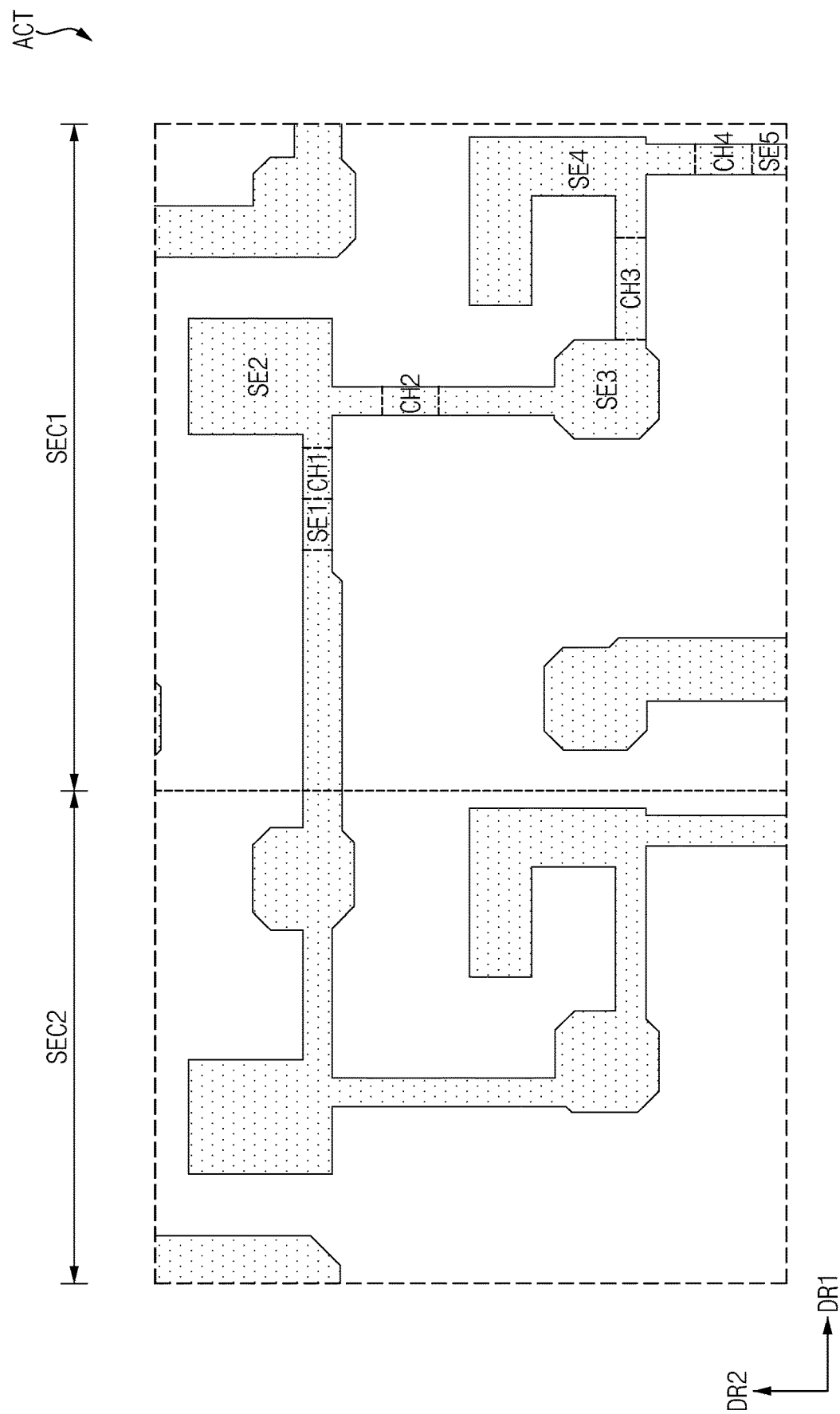
FIGS. 4, 5, 6, 7, 8, 9, 10, 11, 12, 13, 14, 15 and 16 are layout views illustrating the display device of FIG. 1.

Referring to FIGS. 1 and 4, The display device DD may include an active pattern ACT.

The active pattern ACT may include first to fourth channel regions CH1, CH2, CH3, and CH4 spaced apart from each other. The active pattern ACT may include first to fifth regions SE1, SE2, SE3, SE4, and SE5 spaced apart from each other. The first channel region CH1 may be adjacent to the first region SE1 and the second region SE2. The second channel region CH2 may be adjacent to the second region SE2 and the third region SE3. The third channel region CH3 may be adjacent to the third region SE3 and the fourth region SE4. The fourth channel region CH4 may be adjacent to the fourth region SE4 and the fifth region SE5.

The first to fifth regions SE1, SE2, SE3, SE4, and SE5 may serve as an electrode, a signal line, an input terminal of a transistor, an output terminal of a transistor, and/or one terminal of a capacitor.

The first to fourth channel regions CH1, CH2, CH3, and CH4 may overlap a first conductive layer (e.g., a first conductive layer CL1 of FIG. 5) which will be described below and may be channel regions (or active regions) of the third transistor T3 and the fourth transistor T4.

Figure 5:
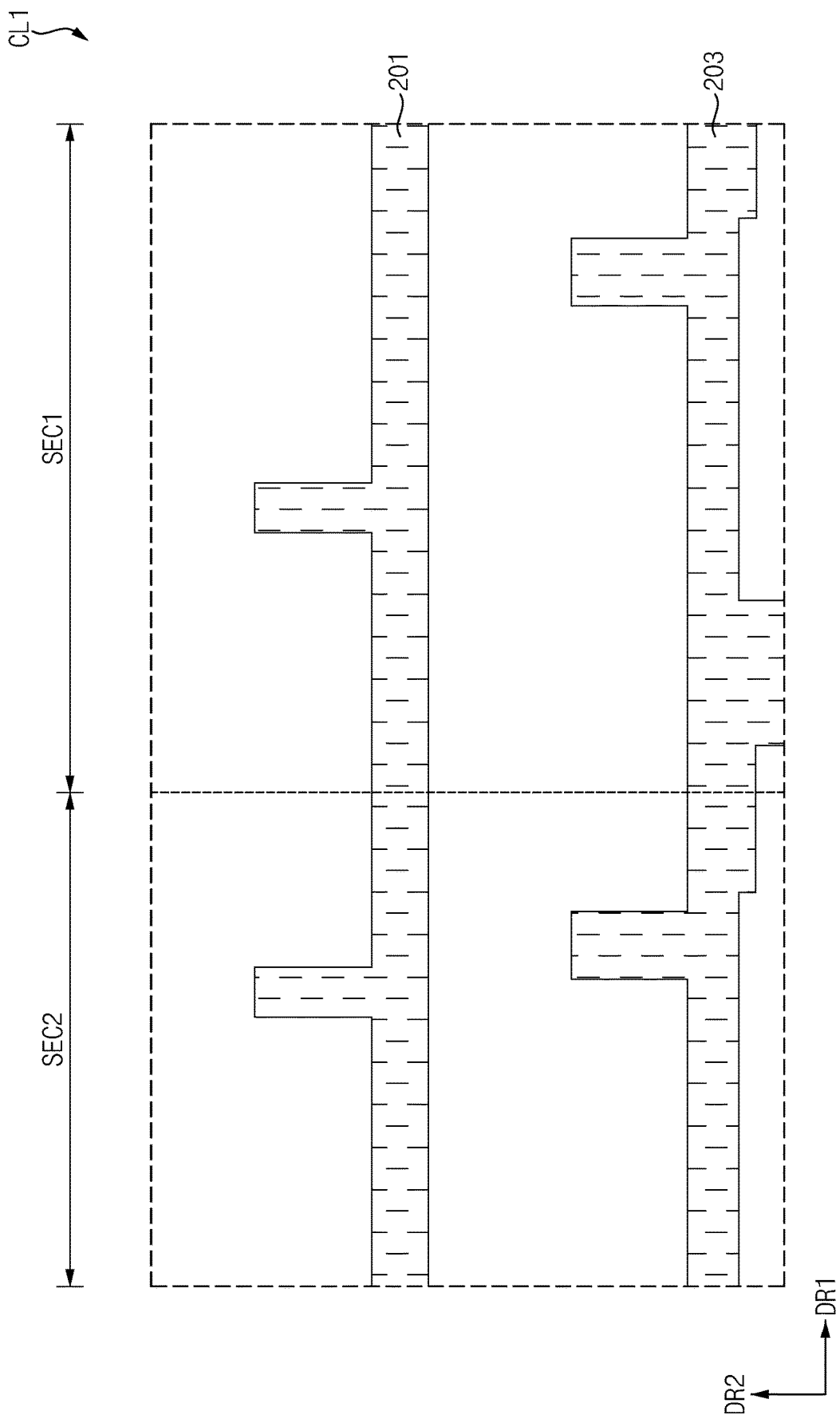
Figure 6:
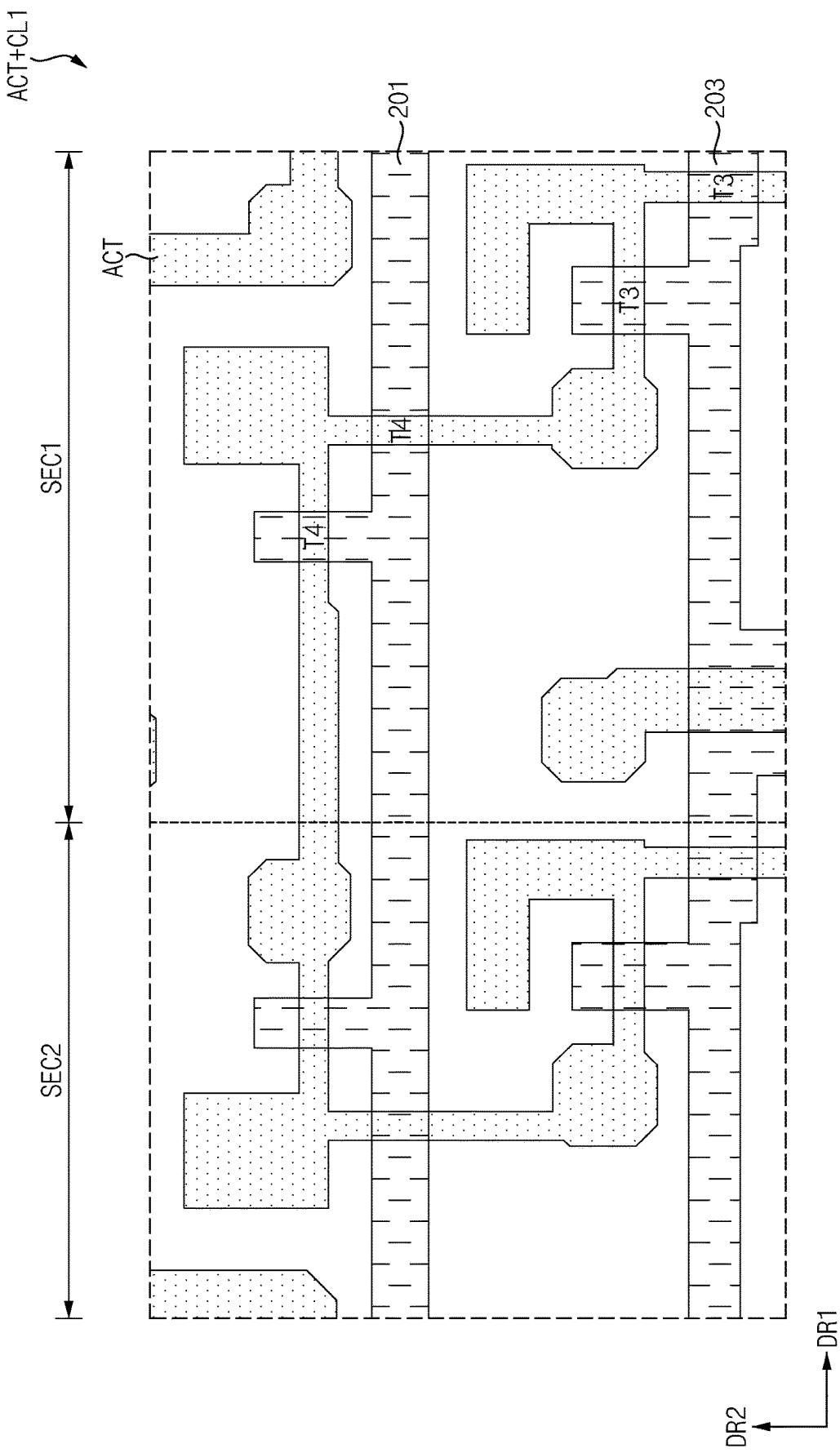

Referring to FIGS. 5 and 6, the display device DD may further include the first conductive layer CL1.

The first conductive layer may be disposed on the active layer ACT. Specifically, a first gate insulating layer may be disposed on the active pattern ACT and the first conductive layer CL1 may be disposed on the first gate insulating layer.

The first conductive layer CL1 may include first gate patterns 201 and second gate patterns 203. The first gate patterns 201 and the second gate patterns 203 may be disposed on a same layer.

The first gate patterns 201 may correspond to the second gate signal line GI of FIG. 3. The second gate patterns 203 may correspond to the first gate signal line GW of FIG. 3. The first conductive layer CL1 may overlap the active pattern ACT. Specifically, portions of the first gate patterns 201 may overlap the first channel region CH1 and the second channel region CH2 of the active pattern ACT. Portions of the second gate patterns 203 may overlap the third channel region CH3 and the fourth channel region CH4 of the active pattern ACT. Accordingly, the first conductive layer CL1 may include a gate electrode of a transistor. In other words, the active pattern ACT and the first conductive layer CL1 may constitute the third transistor T3 and the fourth transistor T4 which are described above with reference to FIG. 3.

The third transistor T3 may include the portions of the second gate patterns 203, and the third region SE3, the third channel region CH3, the fourth region SE4, the fourth channel region CH4, and the fifth region SE5 of the active pattern ACT. The third channel region CH3 may be a channel region of the first sub-transistor T3-1 of FIG. 3 and the fourth channel region CH4 may be a channel region of the second sub-transistor T3-2 of FIG. 3. In other words, the second gate patterns 203 may overlap the third channel region CH3 and the fourth channel region CH4 of the active pattern ACT so as to form second gate electrodes. Each of the second gate electrodes may constitute the gate electrode of each of the first sub-transistor T3-1 and the second sub-transistor T3-2.

The fourth transistor T4 may include the portions of the first gate patterns 201, and the first region SE1, the first channel region CH1, the second region SE2, the second channel region CH2, and the third region SE3 of the active pattern ACT. The first channel region CH1 may be a channel region of the third sub-transistor T4-1 of FIG. 3 and the second channel region CH2 may be a channel region of the fourth sub-transistor T4-2 of FIG. 3. In other words, the first gate patterns 201 may overlap the first channel region CH1 and the second channel region CH2 of the active pattern ACT so as to form first gate electrodes. Each of the first gate electrodes may constitute the gate electrode of each of the third sub-transistor T4-1 and the fourth sub-transistor T4-2.

Figure 7:
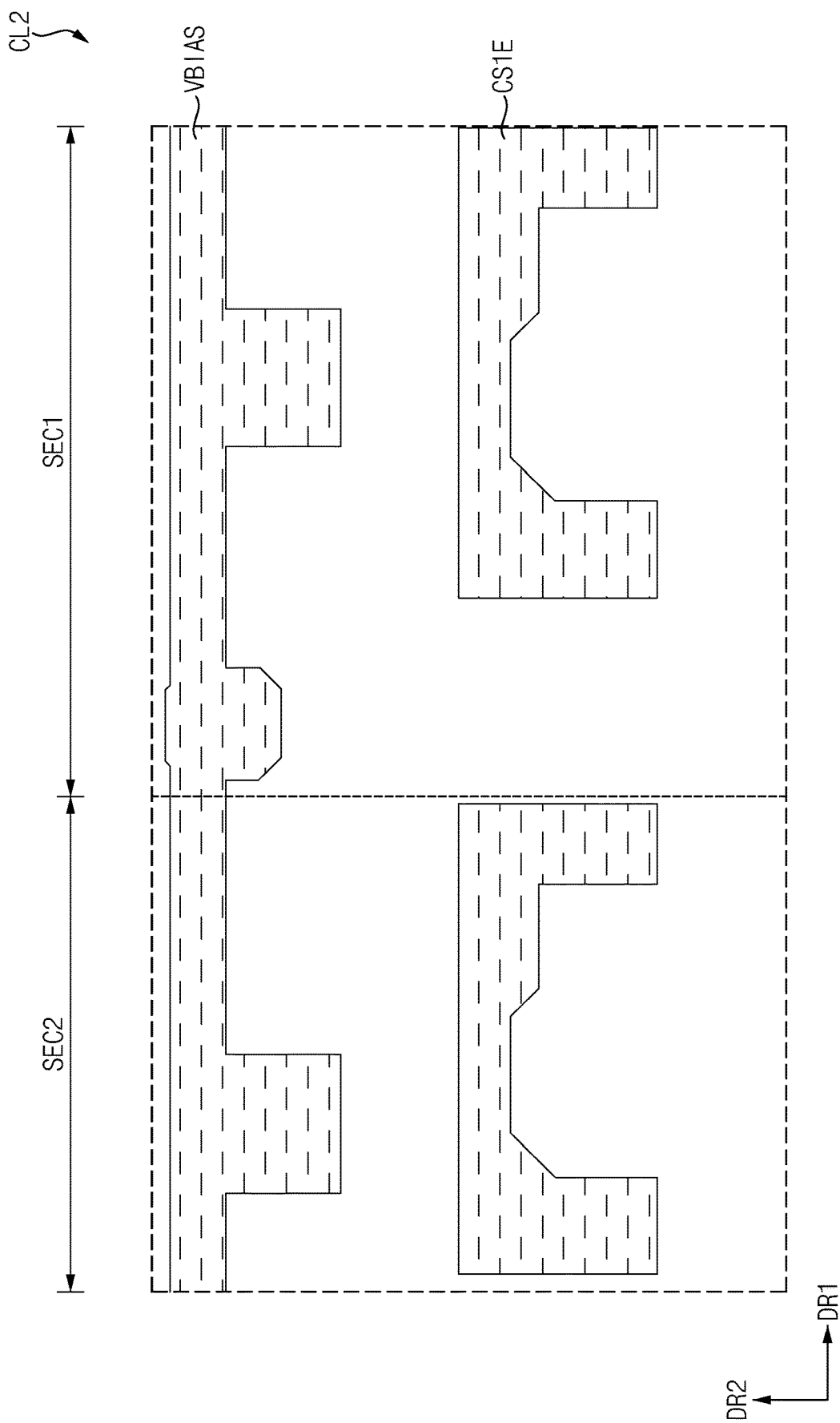
Figure 8:
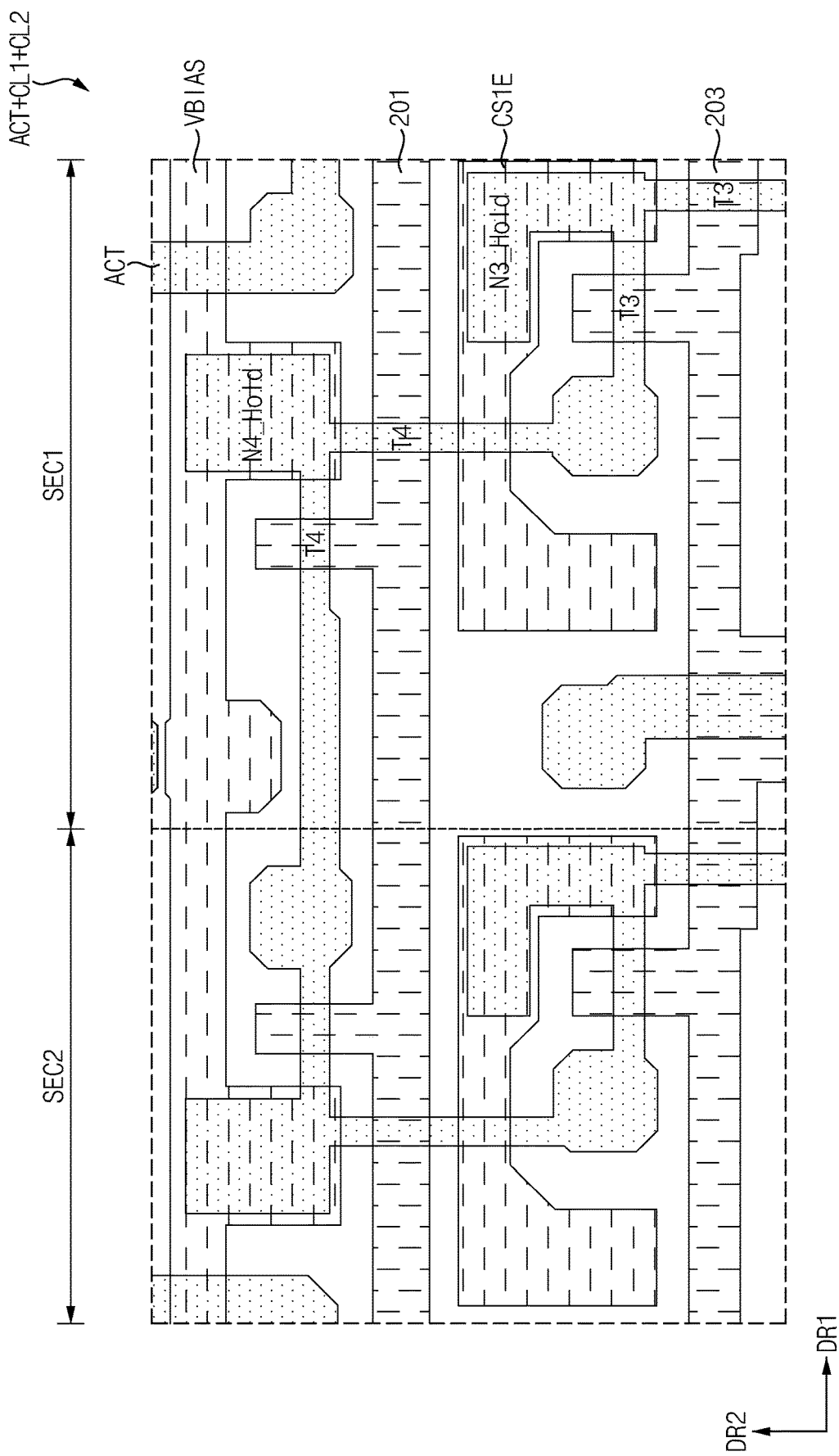

Referring to FIGS. 7 and 8, the display device may further include a second conductive layer CL2. A second gate insulating layer may be disposed on the first conductive layer CL1 and the second conductive layer CL2 may be disposed on the second gate insulating layer.

The second conductive layer CL2 may include a bias pattern VBIAS and a storage pattern CS1E. The bias pattern VBIAS and the storage pattern CS1E may be disposed on a same layer.

The second conductive layer CL2 may overlap the active pattern ACT. Specifically, a portion of the bias pattern VBIAS may overlap the second region SE2 of the active pattern ACT. A portion of the storage pattern CS1E may overlap the fourth region SE4 of the active pattern ACT. Accordingly, the second conductive layer CL2 may constitute a capacitor. In other words, the active pattern ACT and the second conductive layer CL2 may constitute the first hold capacitor N3 HOLD and the second hold capacitor N4 HOLD which are described above with reference to FIG. 3.

The second hold capacitor N4 HOLD may include a portion of the bias pattern VBIAS and the second region SE2 of the active pattern ACT. In other words, the bias pattern VBIAS may overlap the second region SE2 of the active pattern ACT to form the second hold capacitor N4 HOLD. The bias pattern VBIAS overlapping the second region SE2 may be a first storage electrode.

The first hold capacitor N3 HOLD may include a portion of the storage pattern CS1E and the fourth region SE4 of the active pattern ACT. In other words, the storage pattern CS1E may overlap the fourth region SE4 of the active pattern ACT to form the first hold capacitor N3 HOLD. The storage pattern CS1E overlapping the fourth region SE4 may be a second storage electrode.

Figure 9:
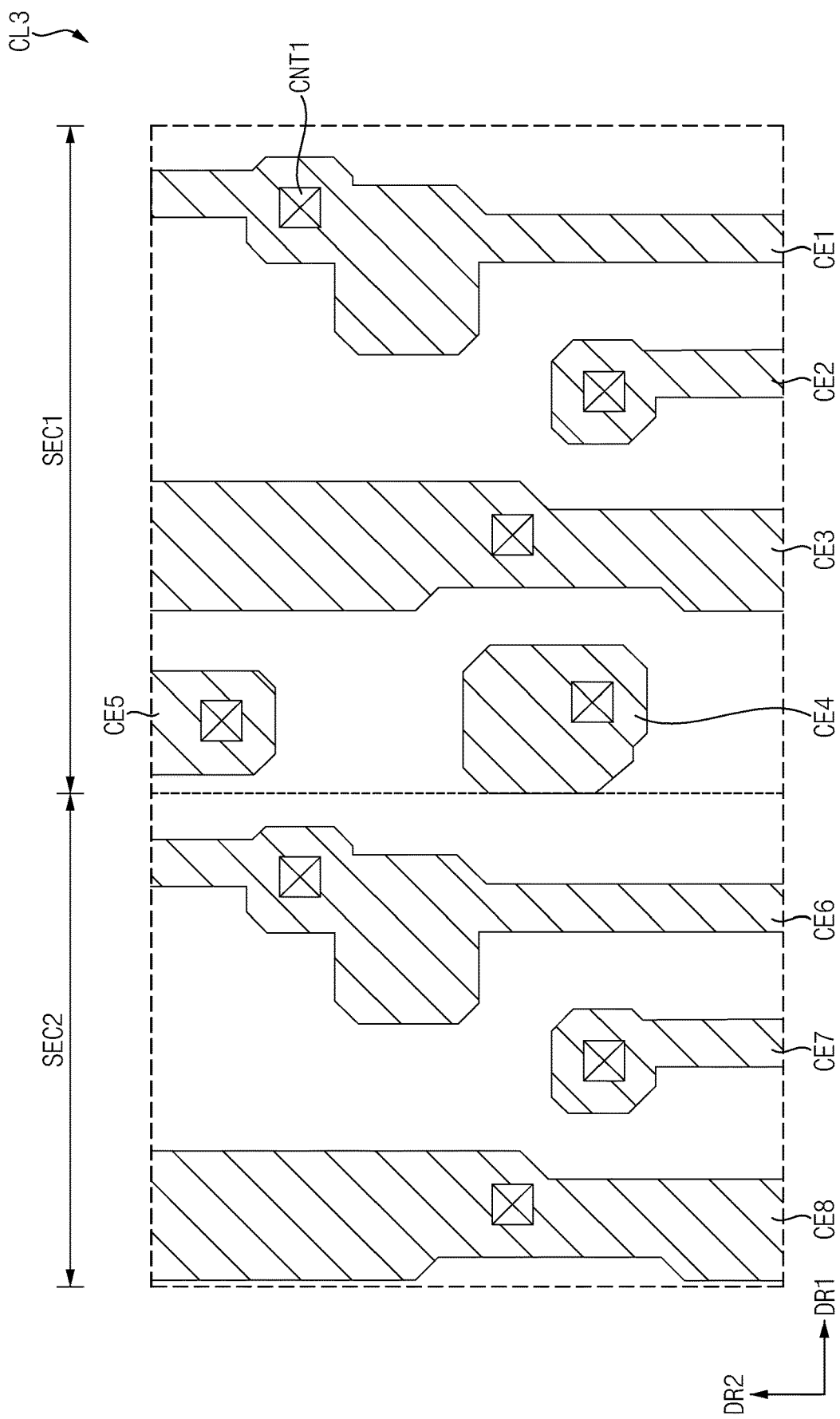
Figure 12:
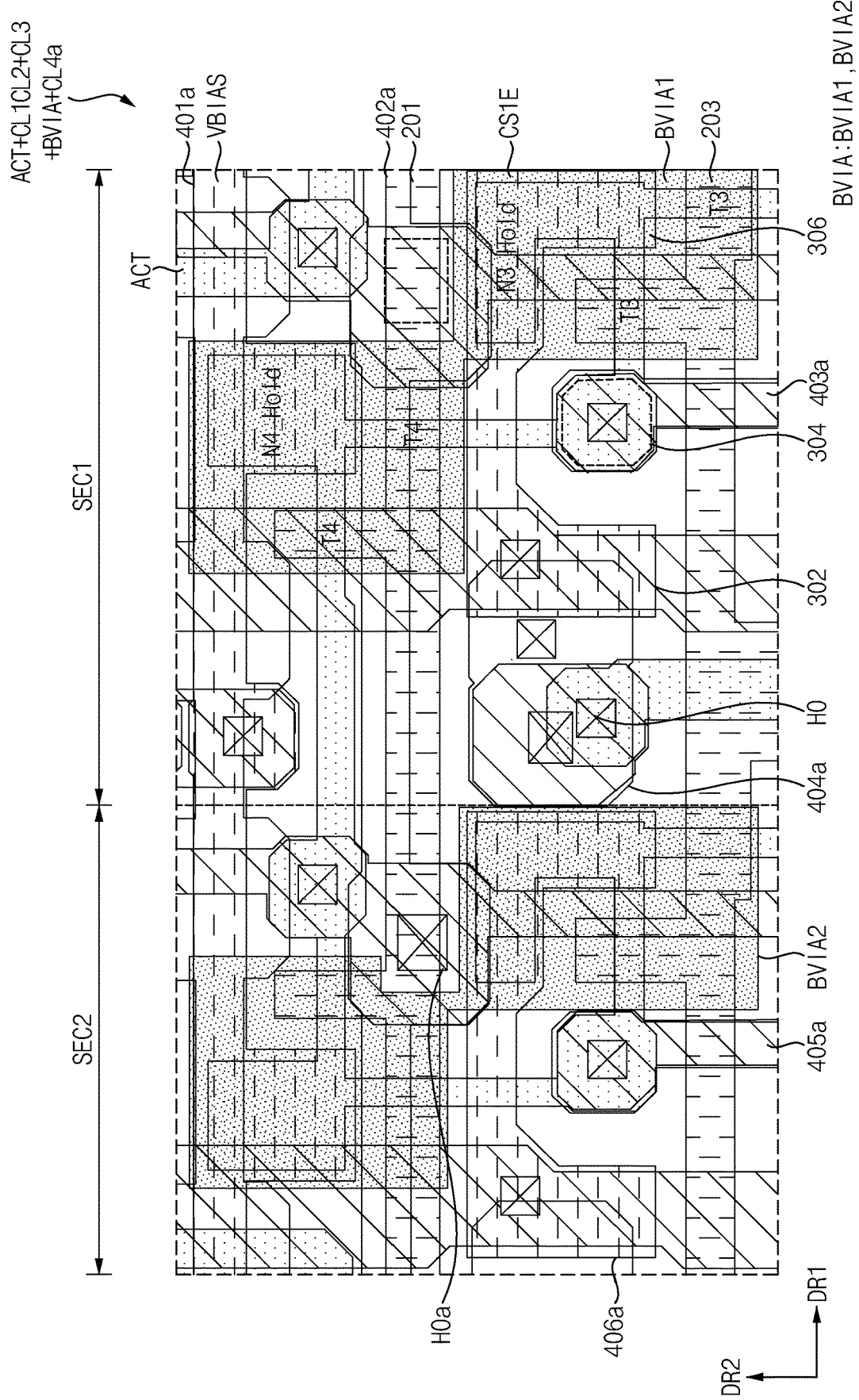

Referring to FIGS. 9 and 12, the display device may further include a third conductive layer CL3.

The third conductive layer CL3 may be disposed on the second conductive layer CL2. An interlayer insulating layer may be disposed on the second conductive layer CL2 and the third conductive layer CL3 may be disposed on the interlayer insulating layer.

The third conductive layer CL3 may include a first lower electrode pattern CE1, a second lower electrode pattern CE2, a third lower electrode pattern CE3, a fourth lower electrode pattern CE4, a fifth lower electrode pattern CE5, a sixth lower electrode pattern CE6, a seventh lower electrode pattern CE7, and an eighth lower electrode pattern CE8. The first lower electrode pattern CE1, the second lower electrode pattern CE2, the third lower electrode pattern CE3, the fourth lower electrode pattern CE4, the fifth lower electrode pattern CE5, the sixth lower electrode pattern CE6, the seventh lower electrode pattern CE7, and the eighth lower electrode pattern CE8 may be disposed on a same layer.

Each of the first to third lower electrode patterns CE1, CE2, and CE3 and the sixth to eighth lower electrode patterns CE6, CE7, and CE8 may extend in the second direction DR2. Each of the fourth and fifth lower electrode patterns CE4 and CE5 may have an island shape. A first contact hole CNT1 may be formed through the interlayer insulating layer ILD in regions corresponding to each of the first lower electrode pattern CE1, the fourth lower electrode pattern CE4, and the sixth lower electrode pattern CE6. For example, the first contact hole CNT1 may be defined at a position in which the first lower electrode pattern CE1 and the active pattern ACT overlap each other, a position in which the fourth lower electrode pattern CE4 and the active pattern ACT overlap each other, a position in which the sixth lower electrode pattern CE6 and the active pattern ACT overlap each other, and the like.

A portion of the first lower electrode pattern CE1 may overlap a portion of the bias pattern VBIAS, a portion of the active pattern ACT, a portion of the first gate patterns 201, a portion of the storage pattern CS1E, and a portion of the second gate patterns 203.

A portion of the second lower electrode pattern CE2 may overlap a portion of the active pattern ACT and a portion of the second gate patterns 203. The second lower electrode pattern CE2 may electrically contact with the third region SE3 of the active pattern ACT.

A portion of the third lower electrode pattern CE3 may overlap a portion of the bias pattern VBIAS, a portion of the active pattern ACT, a portion of the first gate patterns 201, a portion of the storage pattern CS1E, and a portion of the second gate patterns 203. The portion of the third lower electrode pattern CE3 may electrically contact with the storage pattern CS1E.

A portion of the fourth lower electrode pattern CE4 may overlap a portion of the active pattern ACT.

A portion of the fifth lower electrode pattern CE5 may overlap a portion of the bias pattern VBIAS.

A portion of the sixth lower electrode pattern CE6 may overlap a portion of the bias pattern VBIAS, a portion of the active pattern ACT, a portion of the first gate patterns 201, the storage pattern CS1E, and a portion of the second gate patterns 203.

A portion of the seventh lower electrode pattern CE7 may overlap a portion of the active pattern ACT and portions of the second gate patterns 203.

A portion of the eighth lower electrode pattern CE8 may overlap a portion of the bias pattern VBIAS, a portion of the active pattern ACT, a portion of the first gate patterns 201, the storage pattern CS1E, and a portion of the second gate patterns 203.

Figure 10:
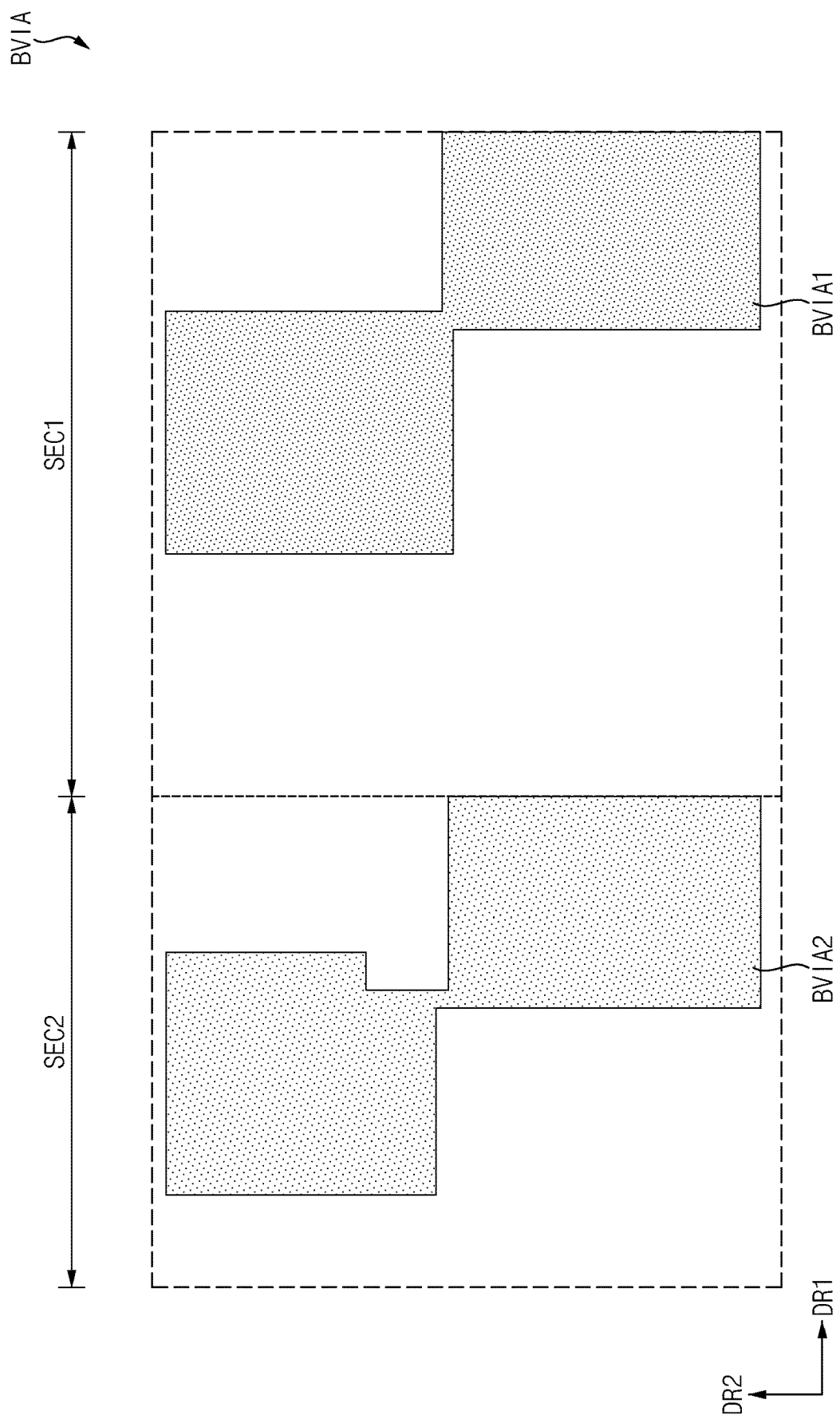

Referring to FIGS. 10 and 12, the display device may further include a shielding pattern BVIA.

The shielding pattern BVIA may be disposed on the interlayer insulating layer ILD. In an embodiment, the shielding pattern BVIA and the third conductive layer CL3 may be disposed on a same layer.

The shielding pattern BVIA may overlap the third transistor T3, the fourth transistor T4, the first hold capacitor N3 HOLD, and the second hold capacitor N4 HOLD.

In this case, the shielding pattern BVIA may not overlap the first via hole HOa. An asymmetrical shape of the shielding pattern BVIA located in each of the first section SEC1 and the second section SEC2 will be described specifically below with reference to FIGS. 15 and 16.

The shielding pattern BVIA may include a black material. For example, the black material may include an inorganic material or an organic material. For example, the organic black material may include a resin having a dark color. Accordingly, the shielding pattern BVIA may minimize influence of a light on the third transistor T3, the fourth transistor T4, the first hold capacitor N3 HOLD, and the second hold capacitor N4 HOLD.

Figure 11:
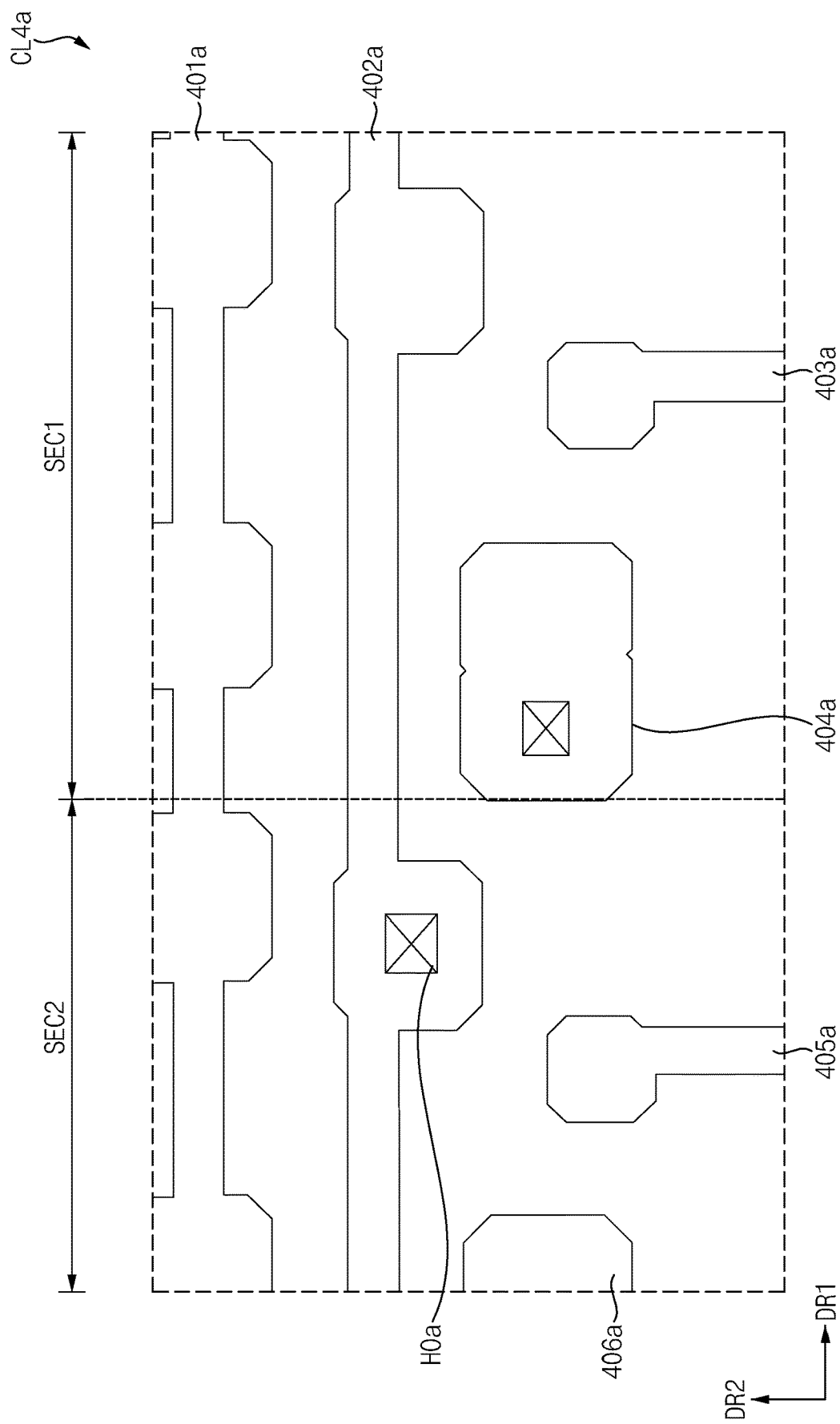

Referring to FIGS. 11 and 12, the display device may further include a fourth conductive layer CL4a.

The fourth conductive layer CL4a may be disposed on the third conductive layer CL3. Specifically, a first via insulating layer may be disposed on the third conductive layer, and the fourth conductive layer CLa may be disposed on the first via insulating layer.

The fourth conducive layer CL4a may include a first intermediate electrode pattern 401a, a second intermediate electrode pattern 402a, a third intermediate electrode pattern 403a, a fourth intermediate electrode pattern 404a, a fifth intermediate electrode pattern 405a, and a sixth intermediate electrode pattern 406a. The first intermediate electrode pattern 401a, the second intermediate electrode pattern 402a, the third intermediate electrode pattern 403a, the fourth intermediate electrode pattern 404a, the fifth intermediate electrode pattern 405a, and the sixth intermediate electrode pattern 406a may be disposed on a same layer.

Each of the first intermediate electrode pattern 401a and the second intermediate electrode pattern 402a may extend in the first direction DR1. Each of the third intermediate electrode pattern 403a and the fifth intermediate electrode pattern 405a may extend in the second direction DR2. Each of the fourth intermediate electrode pattern 404a and the sixth intermediate electrode pattern 406a may have an island shape.

The first via hole HOa may be defined in the first via insulating layer. The first via hole HOa exposing at least a portion of the sixth lower electrode pattern CE6 may be defined in the first via insulating layer. The first via hole HOa will be described specifically below with reference to FIGS. 15 and 16.

The first intermediate electrode pattern 401a may overlap the active pattern ACT, the bias pattern VBIAS, the first lower electrode pattern CE1, the third lower electrode pattern CE3, the fifth lower electrode pattern CE5, the sixth lower electrode pattern CE6, the eighth lower electrode pattern CE8, a first shielding pattern BVIA1, and a second shielding pattern BVIA2.

The second intermediate electrode pattern 402a may overlap the active pattern ACT, the storage pattern CS1E, the first lower electrode pattern CE1, the third lower electrode pattern CE3, the sixth lower electrode pattern CE6, the eighth lower electrode pattern CE8, the first shielding pattern BVIA1, and the second shielding pattern BVIA2.

The third intermediate electrode pattern 403a may overlap the active pattern ACT and the second lower electrode pattern CE2.

The fourth intermediate electrode pattern 404a may overlap the active pattern ACT, the storage pattern CS1E, the third lower electrode pattern CE3, and the fourth lower electrode pattern CE4.

The fifth intermediate electrode pattern 405a may overlap the active pattern ACT and the seventh lower electrode pattern CE7.

The sixth intermediate electrode pattern 406a may overlap the storage pattern CS1E, and the eighth lower electrode pattern CE8.

Although the second intermediate electrode pattern 402a has been described in FIGS. 11 and 12 as being the first voltage initialization line VINT, a second intermediate electrode pattern 402b may be the second voltage initialization line VAINT in FIG. 15, which will be described below. The second intermediate electrode pattern 402b will be described specifically below with reference to FIGS. 15 and 16.

Figure 13:
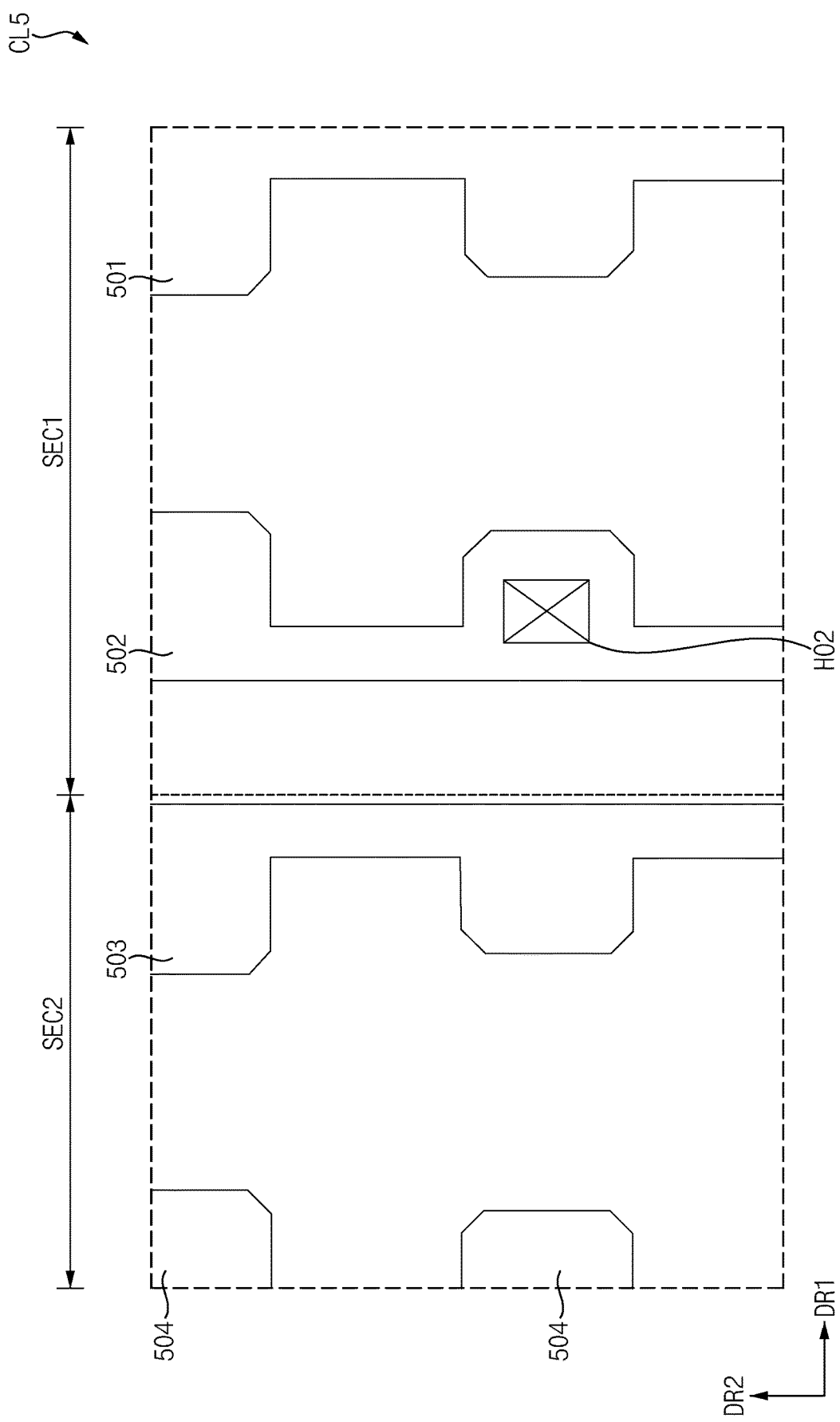
Figure 14:
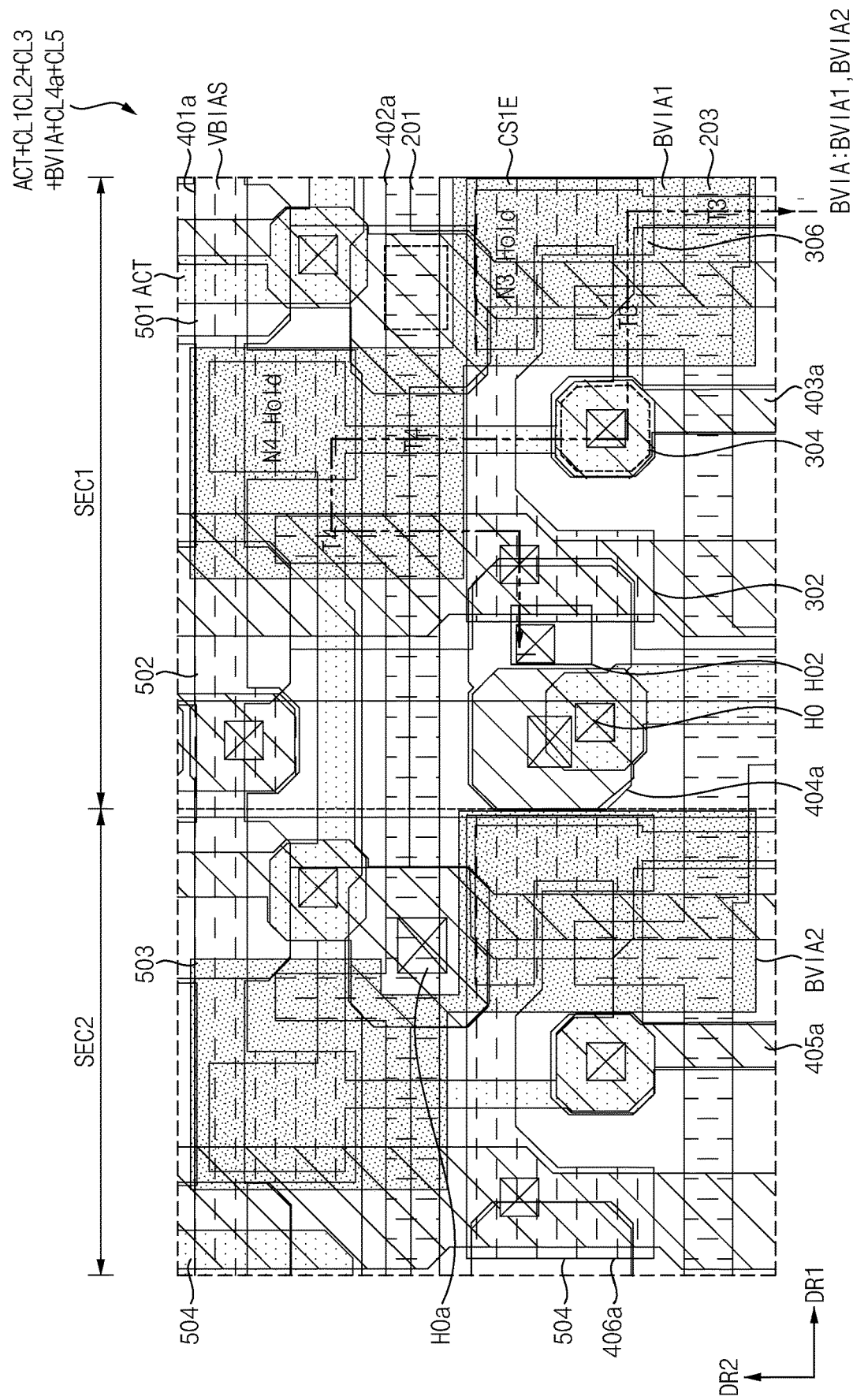

Referring to FIGS. 13 and 14, the display device may further include a fifth conductive layer CL5.

The fifth conductive layer CL5 may be disposed on the fourth conductive layer CL4a. Specifically, a second via insulating layer may be disposed on the fourth conductive layer CL4a, and the fifth conductive layer CL5 may be disposed on the second via insulating layer.

The fifth conductive layer CL5 may include a first upper electrode pattern 501, a second upper electrode pattern 502, a third upper electrode pattern 503, and a fourth upper electrode pattern 504. The first upper electrode pattern 501, the second upper electrode pattern 502, the third upper electrode pattern 503, and the fourth upper electrode pattern 504 may be disposed on a same layer.

Each of the first upper electrode pattern 501, the second upper electrode pattern 502, the third upper electrode pattern 503, and the fourth upper electrode pattern 504 may extend in the second direction DR2.

Each of the second upper electrode pattern 502 and the fourth upper electrode pattern 504 may include a portion protruding in the first direction DR1, and each of the first upper electrode pattern 501 and the third upper electrode pattern 503 may include a portion protruding in a direction opposite to the first direction DR1.

An intermediate via hole HO2 may be defined in the second via insulating layer VIA2. The intermediate via hole HO2 exposing at least a portion of the fourth intermediate electrode pattern 404a may be defined in the second via insulating layer VIA2.

The first upper electrode pattern 501 may overlap the active pattern ACT, the first gate patterns 201, the second gate patterns 203, the bias pattern VBIAS, the storage pattern CS1E, the first lower electrode pattern CE1, the first shielding pattern BVIA1, the first intermediate electrode pattern 401a, and the second intermediate electrode pattern 402a.

The second upper electrode pattern 502 may overlap the active pattern ACT, the first gate patterns 201, the second gate patterns 203, the bias pattern VBIAS, the storage pattern CS1E, the third lower electrode pattern CE3, the fourth lower electrode pattern CE4, the fifth lower electrode pattern CE5, the first shielding pattern BVIA1, the first intermediate electrode pattern 401a, the second intermediate electrode pattern 402a, and the fourth intermediate electrode pattern 404a. A portion of the second upper electrode pattern 502 may electrically contact with the fourth intermediate electrode pattern 404a.

The third upper electrode pattern 503 may overlap the active pattern ACT, the first gate patterns 201, the second gate patterns 203, the bias pattern VBIAS, the storage pattern CS1E, the sixth lower electrode pattern CE6, the second shielding pattern BVIA2, the first intermediate electrode pattern 401a, and the second intermediate electrode pattern 402a.

The fourth upper electrode pattern 504 may overlap the active pattern ACT, the first gate patterns 201, the second gate patterns 203, the bias pattern VBIAS, the storage pattern CS1E, the eighth lower electrode pattern CE8, the second shielding pattern BVIA2, the first intermediate electrode pattern 401a, the second intermediate electrode pattern 402a, and the sixth intermediate electrode pattern 406a.

As shown in FIG. 14, the first shielding pattern BVIA1 and the second shielding pattern BVIA2 may have mutually different shapes in the plan view. Specifically, the first shielding pattern BVIA1 located in the first section SEC1 and the second shielding pattern BVIA2 located in the second section SEC2 may have the mutually different shapes in the plan view. For example, the second shielding pattern BVIA2 may be adjacent to the first via hole HOa, and the first shielding pattern BVIA1 may be spaced apart from the second shielding pattern BVIA2.

Referring to FIGS. 2, 3, 11, and 15, the display device may have a structure in which the first voltage initialization line VINT and the second voltage initialization line VAINT are separated from each other.

The second intermediate electrode pattern 402a of FIG. 11 may be the first voltage initialization line VINT. The second intermediate electrode pattern 402a may correspond to the first voltage initialization line VINT disposed in the first row R1 of FIG. 2.

When the second intermediate electrode pattern 402a corresponds to the first voltage initialization line VINT, the first via hole HOa may be defined in the second intermediate electrode pattern 402a located in the second section SEC2. The first via hole HOa may correspond to the first via hole HOa formed at a position overlapping the second column C2 of FIG. 2.

Figure 15:
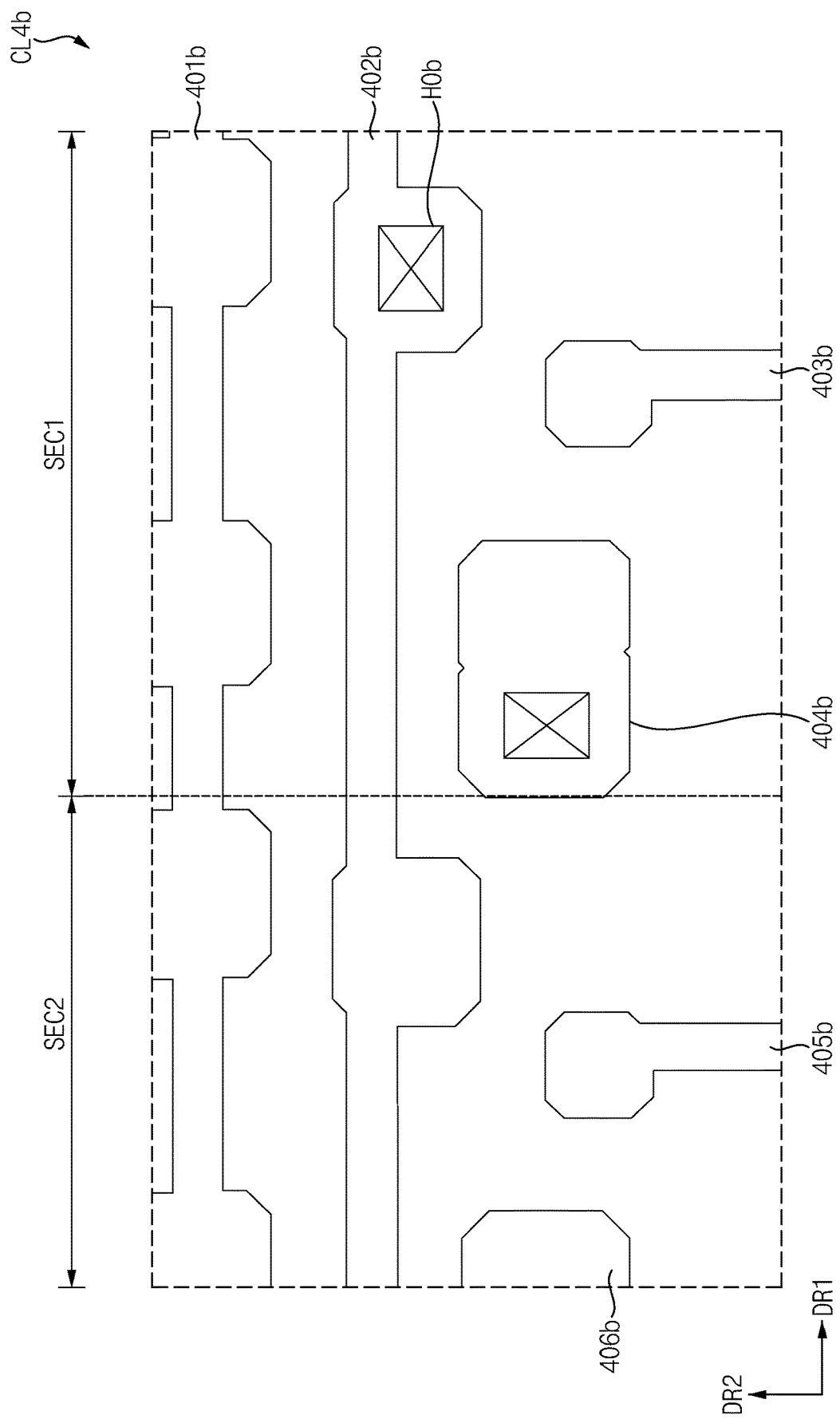

The second intermediate electrode pattern 402b of FIG. 15 may be the second voltage initialization line VAINT. The second intermediate electrode pattern 402b may correspond to the second voltage initialization line VAINT disposed in the second row R2 of FIG. 2.

When the second intermediate electrode pattern 402b corresponds to the second voltage initialization line VAINT, the second via hole HOb may be defined in the second intermediate electrode pattern 402b located in the first section SEC1. The second via hole HOb may correspond to the second via hole HOb formed at a position overlapping the first column C1 of FIG. 2.

Referring to FIGS. 2, 3, 11, 14, and 15, the shielding pattern BVIA may not overlap a via hole (e.g., the first via hole HOa and a second via hole HOb). According to positions of the via holes formed in the second via insulating layer VIA2, first shielding patterns BVIA1 and BVIA1$b$, and second shielding patterns BVIA2 and BVIA2$b$ may have mutually different shapes in the plan view.

As shown in FIGS. 2 and 14, the shielding pattern BVIA overlapping the first voltage initialization line VINT may not overlap the via hole in the second section SEC2. Specifically, the second shielding pattern BVIA2 may be adjacent to the first via hole HOa, and the first shielding pattern BVIA1 may be spaced apart from the second shielding pattern BVIA2. Since the second shielding pattern BVIA2 are disposed in a region away from the first via hole HOa, the second shielding pattern BVIA2 may have a shape that is different from a shape of the first shielding pattern BVIA1 in the plan view.

Figure 16:
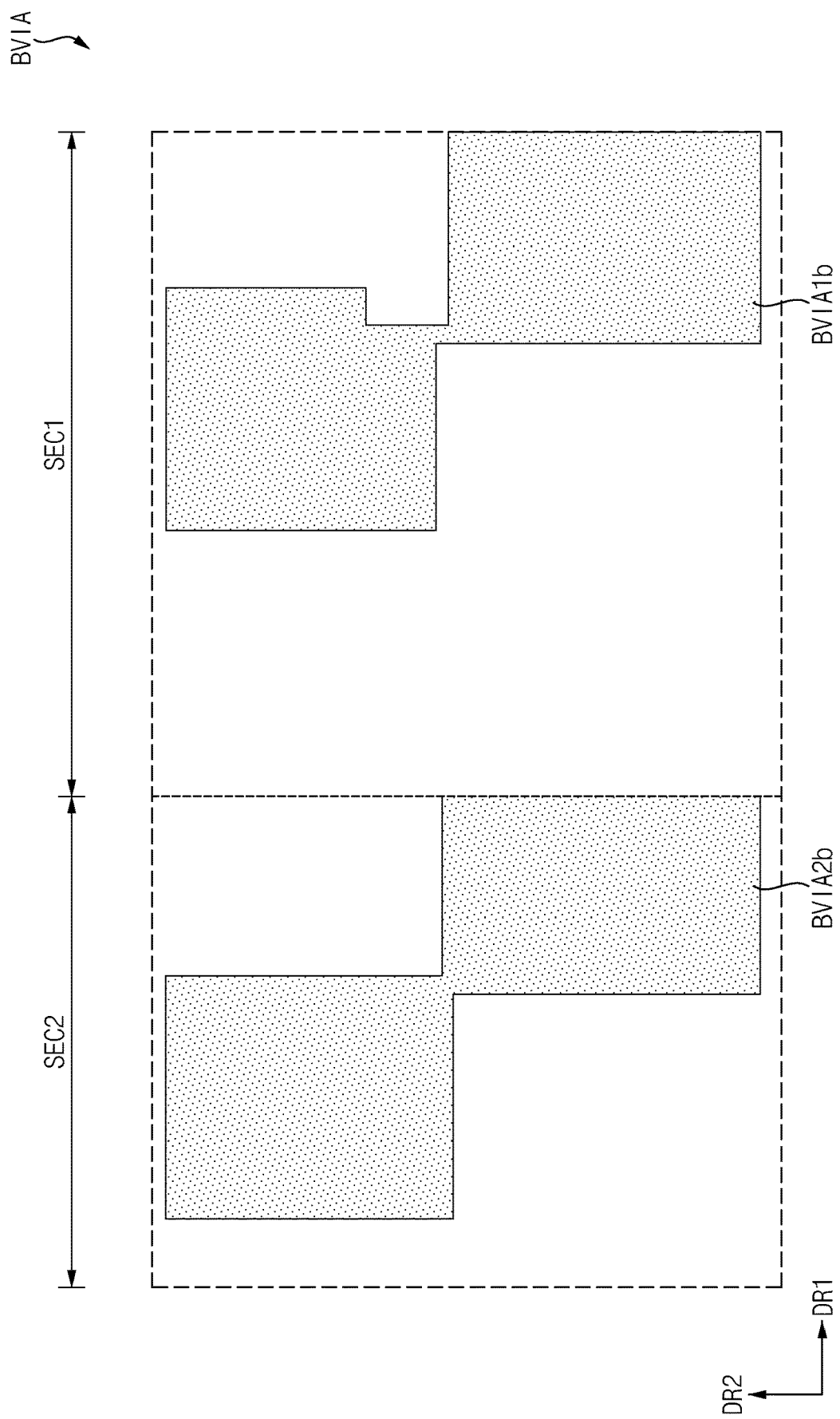

As shown in FIGS. 2, 15, and 16, the shielding pattern BVIA overlapping the second voltage initialization line VAINT may not overlap the via hole in the first section SEC1. Specifically, the first shielding pattern BVIA1$b$ may be adjacent to the second via hole HOb, and the second shielding pattern BVIA2$b$ may be spaced apart from the first shielding pattern BVIA1$b$. Since the second shielding pattern BVIA2$b$ are disposed in a region away from the second via hole HOb, the first shielding pattern BVIA1$b$ may have a shape that is different from a shape of the second shielding pattern BVIA2$b$ in the plan view.

Figure 17:
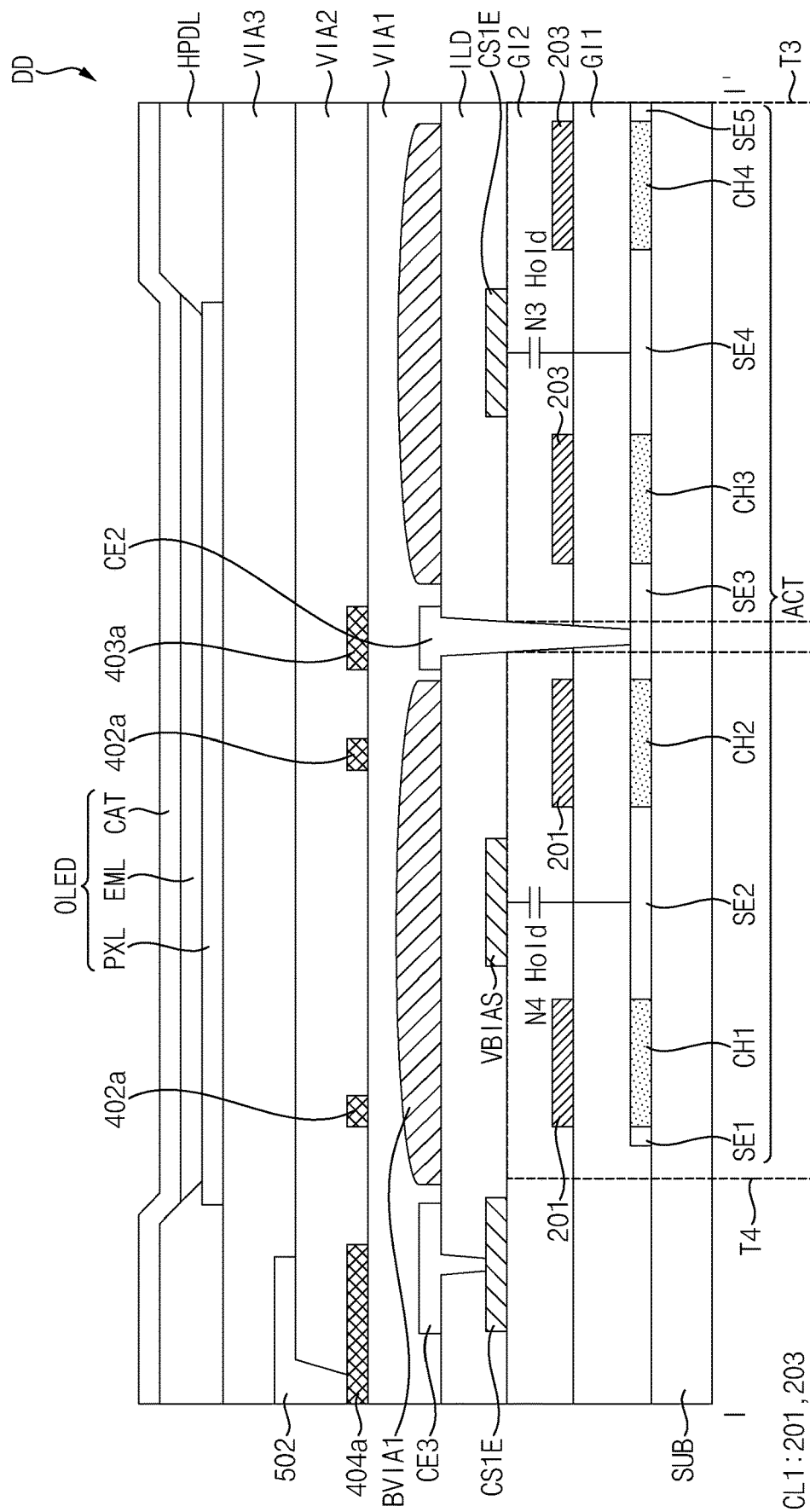
FIG. 17 is a sectional view taken along line I-I' of FIG. 14.

FIG. 17 is a sectional view taken along line I-I' of FIG. 14.

Referring to FIG. 17, the display device according to an embodiment of the disclosure may include a substrate SUB, the active pattern ACT, a first gate insulating layer GI1, the first gate patterns 201, the second gate patterns 203, a second gate insulating layers GI2, the second conductive layer CL2, an interlayer insulating layer ILD, the third conductive layer CL3, the shielding pattern BVIA1, a first via insulating layer VIA1, the fourth conductive layer CL4, a second via insulating layer VIA2, the fifth conductive layer CL5, a third via insulating layer VIA3, a pixel defining layer HPDL, and the light emitting element OLED.

The substrate SUB may include a transparent material or an opaque material. The substrate SUB may be a transparent resin substrate. Examples of the transparent resin substrate include a polyimide substrate or the like.

The active pattern ACT may be disposed on the substrate SUB. Specifically, the active pattern ACT may be disposed on a buffer layer (not shown). As described above with reference to FIG. 3, the active pattern ACT may include the first to fourth channel regions CH1, CH2, CH3, and CH4 spaced apart from each other, and first to fifth regions SE1, SE2, SE3, SE4, and SE5 spaced apart from each other. The active pattern ACT may be connected to a conductive pattern. For example, the third region SE3 of the active pattern ACT may be connected to the second lower electrode pattern CE2.

The first gate insulating layer GI1 may be disposed on the substrate SUB. Specifically, the first gate insulating layer GI1 may be disposed on the substrate SUB and the active pattern ACT. That is, the first gate insulating layer GI1 may cover the active pattern ACT.

The first conductive layer CL1 may be disposed on the first gate insulating layer GI1. The first conductive layer CL1 may include the first gate patterns 201 and the second gate patterns 203. The first gate patterns 201 and the second gate patterns 203 may be disposed on a same layer.

The portions of the first gate patterns 201 may overlap the first channel region CH1 and the second channel region CH2 of the active pattern ACT. The portions of the first gate patterns 201 overlapping the first channel region CH1 and the second channel region CH2 of the active pattern ACT may be the first gate electrodes of the fourth transistor T4.

The portions of the second gate patterns 203 may overlap the third channel region CH3 and the fourth channel region CH4 of the active pattern ACT. The portions of the second gate patterns 203 overlapping the third channel region CH3 and the fourth channel region CH4 of the active pattern ACT may be the second gate electrodes of the third transistor T3.

The second gate insulating layer GI2 may be disposed on the first gate insulating layer GI1. Specifically, the second gate insulating layer GI2 may be disposed on the first gate insulating layer GI1 and the first conductive layer CL1. In other words, the second gate insulating layer GI2 may cover the first gate electrodes and the second gate electrodes.

The second conductive layer CL2 may be disposed on the second gate insulating layer GI2. The second conductive layer CL2 may include the bias pattern VBIAS and the storage pattern CS1E. The bias pattern VBIAS and the storage pattern CS1E may be disposed on a same layer.

The portion of the bias pattern VBIAS may overlap the second region SE2 of the active pattern ACT to form the first storage electrode of the second hold capacitor N4 HOLD.

The portion of the storage pattern CS1E may overlap the fourth region SE4 of the active pattern ACT to form the second storage electrode of the first hold capacitor N3 HOLD.

The interlayer insulating layer ILD may be disposed on the second gate insulating layer GI2. Specifically, the interlayer insulating layer ILD may be disposed on the second gate insulating layer GI2 and the second conductive layer CL2. In other words, the interlayer insulating layer ILD may cover the second conductive layer CL2.

The third conductive layer CL3 may be disposed on the interlayer insulating layer ILD. The third conductive layer CL3 may include the second lower electrode pattern CE2 and the third lower electrode pattern CE3. The second lower electrode pattern CE2 and the third lower electrode pattern CE3 may be disposed on a same layer. For example, the second lower electrode pattern CE2 may be connected to a portion (e.g., the third region SE3) of the active pattern ACT, and the third lower electrode pattern CE3 may be connected to the storage pattern CS1E.

The shielding pattern BVIA1 may be disposed on the interlayer insulating layer ILD. In an embodiment, the shielding pattern BVIA1 and the third conductive layer CL3 may be disposed on a same layer.

The shielding pattern BVIA1 may overlap the first gate electrodes, the second gate electrodes, the first storage electrode, and the second storage electrode. In this case, the shielding pattern BVIA1 may not overlap the via holes formed in the second via insulating layer VIA2. Accordingly, the shielding pattern BVIA1 may shield the third transistor T3, the fourth transistor T4, the first hold capacitor N3 HOLD, and the second hold capacitor N4 HOLD from a light.

In addition, the shielding pattern BVIA1 may be covered by the first via insulating layer VIA1. Accordingly, the shielding pattern BVIA1 may not be damaged in a subsequent process (e.g., a via hole formation process, etc.). However, the disclosure is not limited thereto.

In another embodiment, as will be described later with reference to FIG. 25, the shielding pattern BVIA1B and the fourth conductive layer CL4 may be disposed on a same layer. The shielding pattern BVIA1B may overlap the first gate electrodes, the second gate electrodes, the first storage electrode, and the second storage electrode. In this case, the shielding pattern BVIA1B may be formed not to overlap the via holes formed in the second via insulating layer VIA2. In addition, the shielding pattern BVIA1B may be covered by the second via insulating layer VIA2.

In another embodiment, as will be described later with reference to FIG. 26, the shielding pattern BVIA1C and the fifth conductive layer CL5 may be disposed on a same layer. The shielding pattern BVIA1C may overlap the first gate electrodes, the second gate electrodes, the first storage electrode, and the second storage electrode. In this case, the shielding pattern BVIA1C may be formed not to overlap the via holes. In addition, the shielding pattern BVIA1C may be covered by the third via insulating layer VIA3.

A detailed description of the shielding pattern BVIA1B covered by the second via insulating layer VIA2 and the shielding pattern BVIA1C covered by the third via insulating layer VIA3 will be described later with reference to FIGS. 25 and 26.

The first via insulating layer VIA1 may be disposed on the interlayer insulating layer ILD. In an embodiment, the first via insulating layer VIA1 may be disposed on the interlayer insulating layer ILD, the third conductive layer CL3, and the shielding pattern BVIA1. In other words, the first via insulating layer VIA1 may cover the third conductive layer CL3 and the shielding pattern BVIA1.

The second via insulating layer VIA2 and the third via insulating layer VIA3 may be sequentially disposed on the first via insulating layer VIA1.

The fourth conductive layer CL4 may be disposed on the first via insulating layer VIA1. The fourth conductive layer CL4 may include the second intermediate electrode pattern 402a, the third intermediate electrode pattern 403a, and the fourth intermediate electrode pattern 404a. The fourth intermediate electrode pattern 404a may be connected to the second upper electrode pattern 502.

The fifth conductive layer CL5 may be disposed on the second via insulating layer VIA2. The fifth conductive layer CL5 may include the first upper electrode pattern 501 and the second upper electrode pattern 502.

A pixel electrode PXL may be disposed on the third via insulating layer VIA3. For example, the pixel electrode PXL may be the anode electrode. For example, the pixel electrode PXL may be the cathode electrode.

The pixel defining layer HPDL may be disposed on the third via insulating layer VIA3 and the pixel electrode PXL. The pixel defining layer HPDL may have an opening exposing a portion of the pixel electrode PXL. Since the pixel defining layer HPDL has the opening, the pixel defining layer HPDL may define each of the pixels that emits the light.

Alight emitting layer EML may be disposed on the pixel electrode PXL. Specifically, the light emitting layer EML may be formed within the opening of the pixel defining layer HPDL.

A common electrode CAT may be formed on the pixel defining layer HPDL and the light emitting layer EML. For example, the common electrode CAT may be the cathode electrode. Alternatively, the common electrode CAT may be the anode electrode.

Accordingly, the light emitting element OLED including the pixel electrode PXL, the light emitting layer EML, and the common electrode CAT may be disposed on the shielding pattern BVIA1. The light emitting element OLED may correspond to the light emitting element OLED described above with reference to FIG. 3.

FIGS. 18 to 24 are cross-sectional views illustrating a method of manufacturing the display device of FIG. 1.

Hereinafter, redundant descriptions of the display device described above with reference to FIGS. 1 to 17 will be omitted or simplified.

Figure 18:
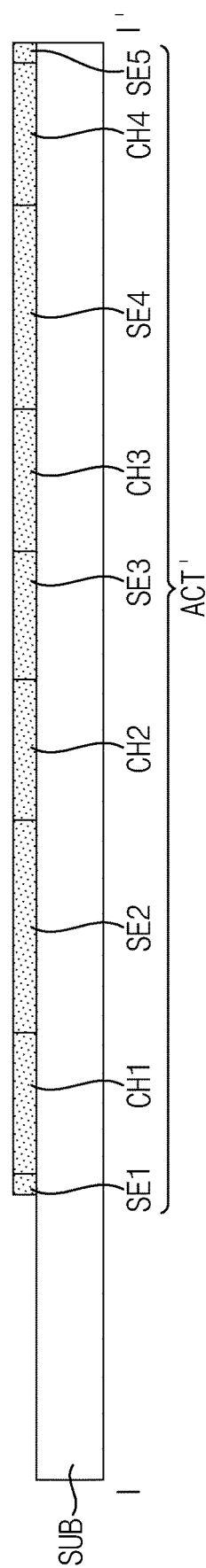
FIGS. 18, 19, 20, 21, 22, 23 and 24 are cross-sectional views illustrating a method of manufacturing the display device of FIG. 1.

Referring to FIGS. 17 and 18, a preliminary active pattern ACT' may be formed on the substrate SUB.

The substrate SUB may be formed of the transparent material or the opaque material. The substrate SUB may be the transparent resin substrate. Examples of the transparent resin substrate include the polyimide substrate and the like.

The active pattern ACT may be formed on the substrate. The active pattern ACT may be formed of a metal oxide semiconductor (e.g., indium gallium zinc oxide (IGZO)), an inorganic semiconductor, an organic semiconductor, and the like. In an embodiment, the active pattern ACT may include amorphous silicon (a-Si) or polycrystalline silicon (poly-Si).

Figure 19:
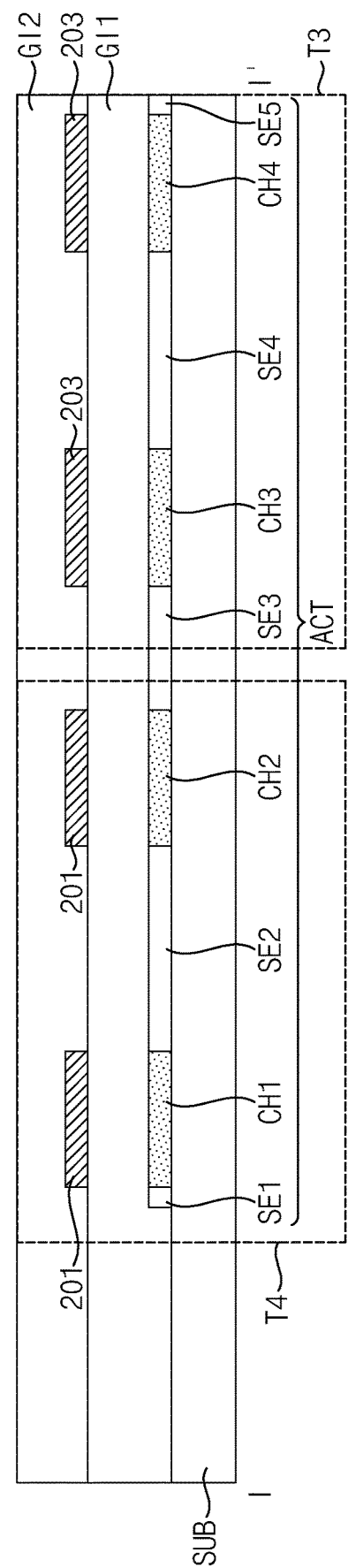

Referring to FIGS. 17 and 19, the first gate insulating layer GI1, the first gate patterns 201, the second gate patterns 203, and the second gate insulating layer GI2 may be sequentially formed on the preliminary active pattern ACT'.

The first gate insulating layer GI1 may be formed on the substrate SUB and the active pattern ACT. The first gate insulating layer GI1 may be formed of an insulating material.

The first gate patterns 201 and the second gate patterns 203 may be formed on the first gate insulating layer GI1. Each of the first gate patterns 201 and the second gate patterns 203 may be formed of a metal, an alloy, a conductive metal oxide, a transparent conductive material, and the like.

The preliminary active pattern ACT' may be doped by using the first gate patterns 201 and the second gate patterns 203 as a self-aligned mask. Accordingly, the active pattern ACT may be formed on the substrate SUB.

The second gate insulating layer GI2 may be formed on the first gate insulating layer GI1, the first gate patterns 201, and the second gate patterns 203. The second gate insulating layer GI2 may be formed of an insulating material.

The first to third regions SE1, SE2, and SE3 and the first to second channel regions CH1 and CH2 of the active pattern ACT, and the first gate electrodes (e.g., portions in which the first gate patterns 201 overlap the first and second channel regions CH1 and CH2 of the active pattern ACT, respectively) may constitute the fourth transistor T4.

The third to fifth regions SE3, SE4, and SE5 and the third to fourth channel regions CH3 and CH4 of the active pattern ACT, and the second gate electrodes (e.g., portions in which the second gate patterns 203 overlap the third and fourth channel regions CH3 and CH4 of the active pattern ACT, respectively) may constitute the third transistor T3.

Figure 20:
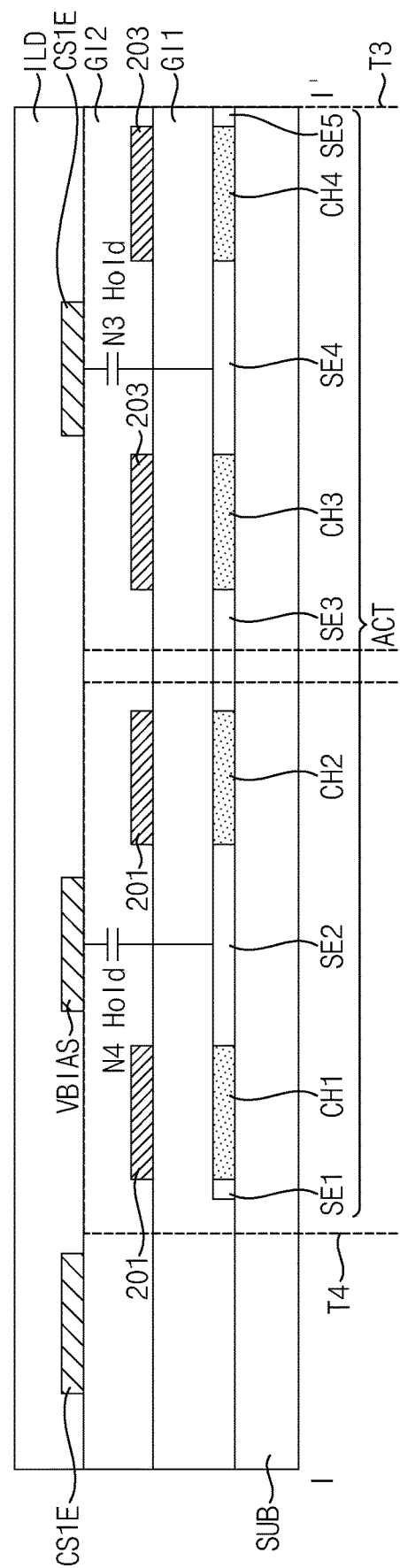

Referring to FIGS. 17 and 20, the bias pattern VBIAS and the storage pattern CS1E, and the interlayer insulating layer ILD may be sequentially formed on the second gate insulating layer GI2.

The bias pattern VBIAS and the storage pattern CS1E may be formed on the second gate insulating layer GI2. Each of the bias pattern VBIAS and the storage pattern CS1E may be formed of a metal, an alloy, a conductive metal oxide, a transparent conductive material, and the like. These may be used alone or in combination with each other.

The interlayer insulating layer ILD may be formed on the bias pattern VBIAS and the storage pattern CS1E. The interlayer insulating layer ILD may be formed of an insulating material.

The second hold capacitor N4 HOLD may be formed by the second region SE2 of the active pattern ACT and the bias pattern VBIAS. The bias pattern VBIAS may overlap the second region SE2 of the active pattern ACT in a plan view so as to form the first storage electrode.

The first hold capacitor N3 HOLD may be formed by the fourth region SE4 of the active pattern ACT and the storage pattern CS1E. The storage pattern CS1E may overlap the fourth region SE4 of the active pattern ACT in a plan view so as to form the second storage electrode.

Figure 21:
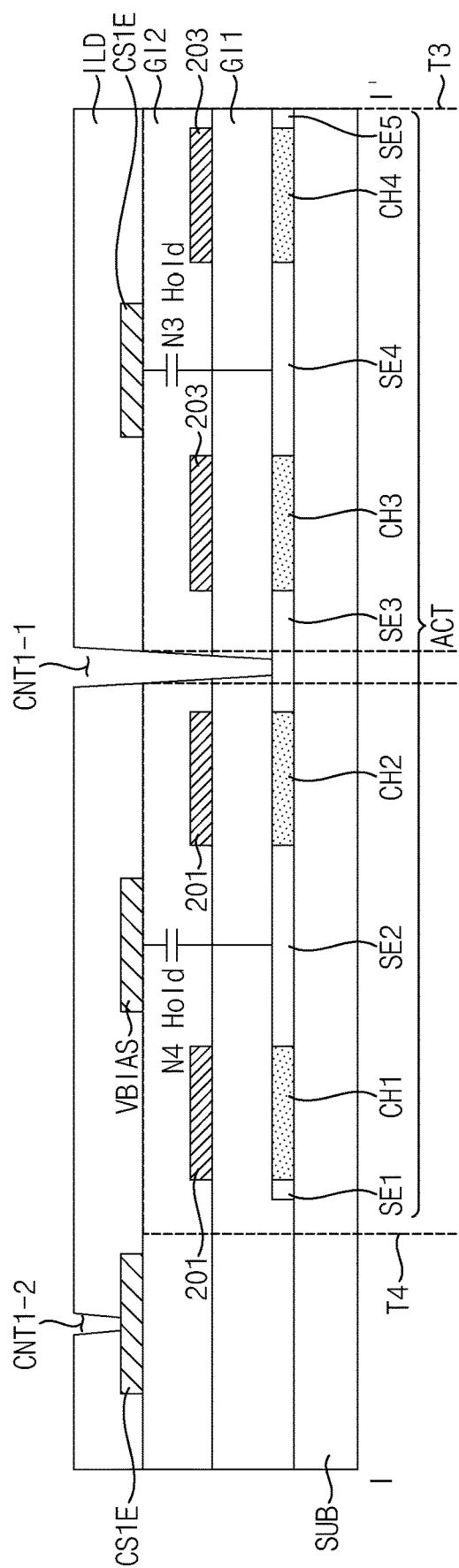
Figure 22:
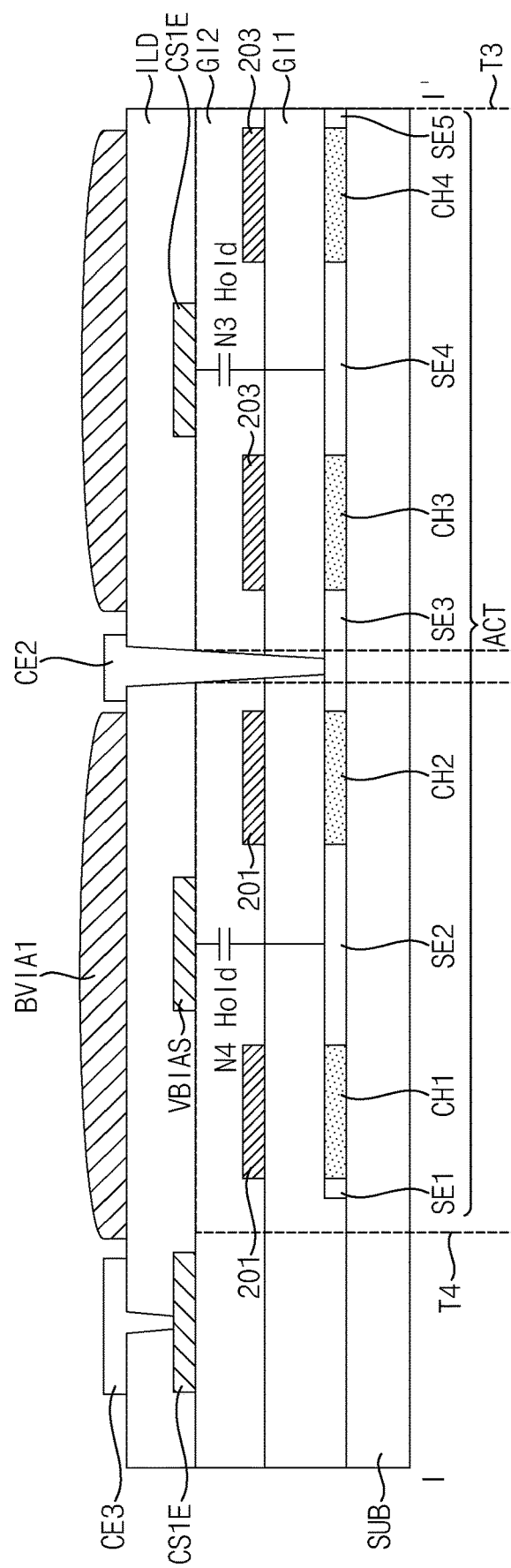

Referring to FIGS. 21 and 22, first contact holes CNT1-1 and CNT1-2 may be formed. Next, the second lower electrode pattern CE2, the third lower electrode pattern CE3, and the shielding pattern BVIA1 may be formed on the interlayer insulating layer ILD.

Each of the second and third lower electrode patterns CE2 and CE3 may be formed to fill the first contact holes CNT1-1 and CNT1-2. For example, the second lower electrode pattern CE2 may be connected to the third region SE3 of the active pattern ACT, and the third lower electrode pattern CE3 may be connected to the storage pattern CS1E. For example, the third lower electrode pattern CE3 may correspond to the first power supply voltage line ELVDD of FIG. 3, and the second lower electrode pattern CE2 may correspond to a node commonly connected to the gate electrode of the first transistor T1, a second terminal of the third sub-transistor T4-1, and a second terminal of the first sub-transistor T3-1.

In an embodiment, the shielding pattern BVIA1 may be formed on the interlayer insulating layer ILD. In other words, the shielding pattern BVIA1, the second lower electrode pattern CE2, and the third lower electrode pattern CE3 may be formed on the same layer.

Figure 23:
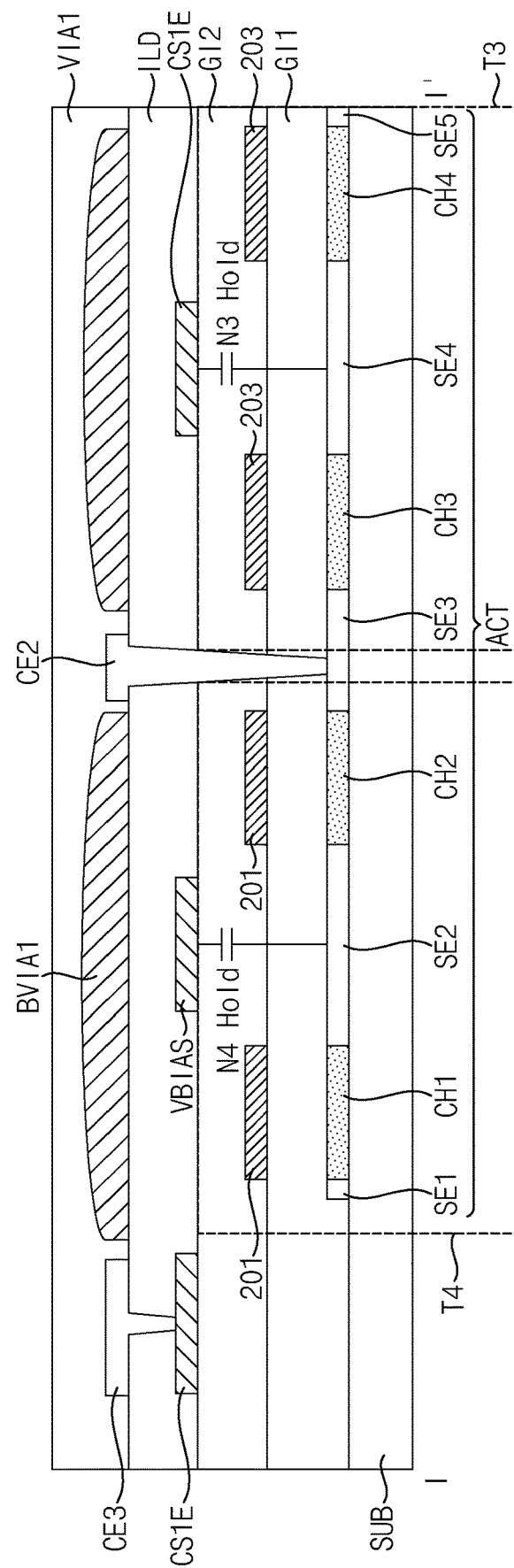

The shielding pattern BVIA1 may overlap the first gate electrodes, the second gate electrodes, the first storage electrode, and the second storage electrode, and may not overlap via holes defined by the first via insulating layer VIA1 of FIG. 23.

The shielding pattern BVIA1 may be formed of the black material. For example, the black material may include the inorganic material or the organic material. For example, the organic black material may include the resin having the dark color. Accordingly, the shielding pattern BVIA1 may minimize the influence of the light on the third transistor T3, the fourth transistor T4, the first hold capacitor N3 HOLD, and the second hold capacitor N4 HOLD.

Referring to FIG. 23, The first via insulating layer VIA1 may be formed on the interlayer insulating layer ILD, the second lower electrode pattern CE2, the third lower electrode pattern CE3, and the shielding pattern BVIA1. The first via insulating layer VIA1 may be formed of the organic insulating material.

Figure 24:
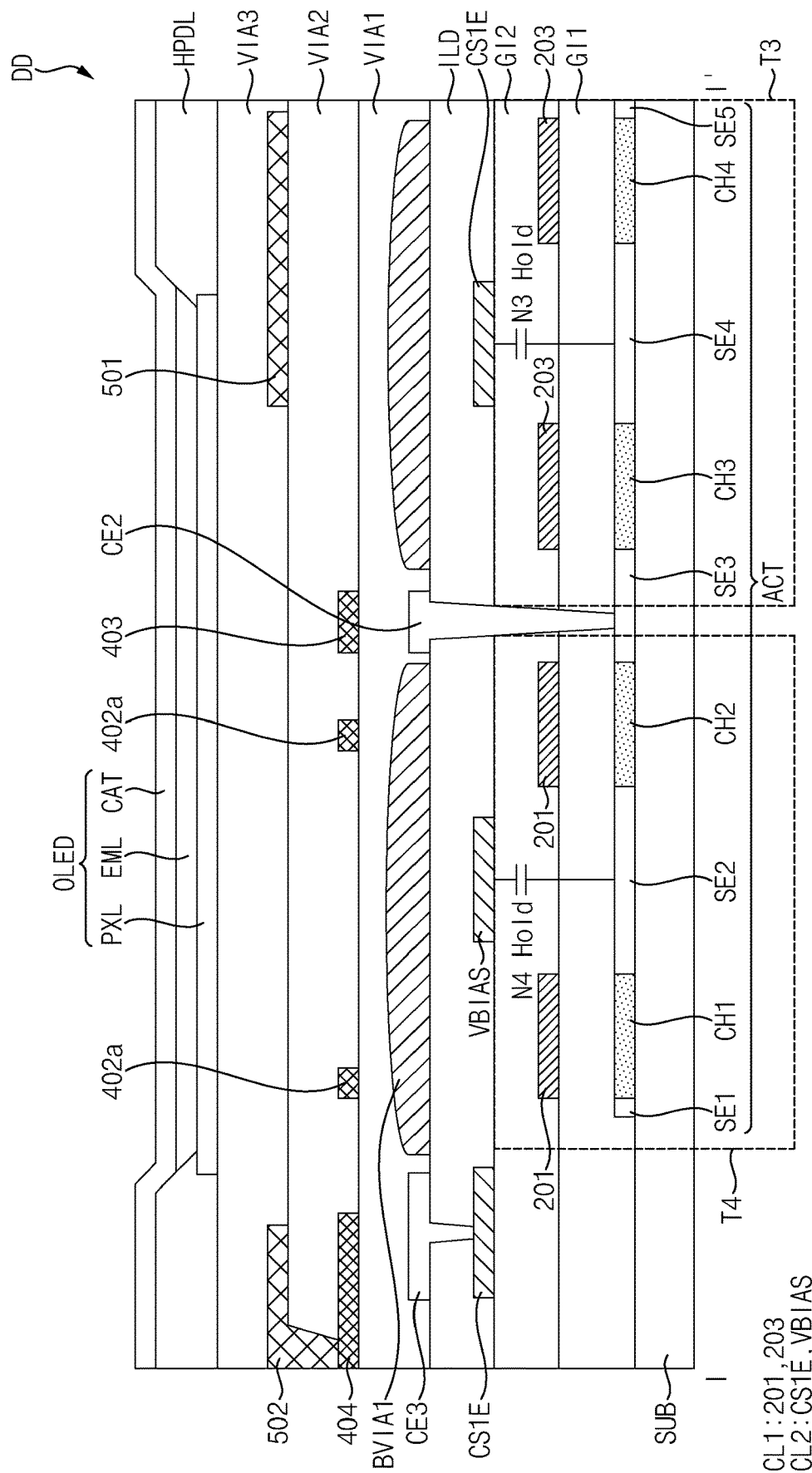

Referring to FIG. 24, the fourth conductive layer CL4, the second via insulating layer VIA2, the fifth conductive layer CL5, the third via insulating layer VIA3, the pixel defining layer HPDL, and the light emitting element OLED may be sequentially formed on the first via insulating layer VIA1.

Each of the fourth conductive layer CL4 and the fifth conductive layer CL5 may be formed of the metal, the alloy, the conductive metal oxide material, the transparent conductive material, and the like. These may be used alone or in combination with each other.

Each of the second via insulating layer VIA2 and the third via insulating layer VIA3 may be formed of the organic insulating material.

The pixel defining layer HPDL may be formed of the organic material or the inorganic material. For example, the pixel defining layer HPDL may be formed of the photoresist, polyacryl resin, polyimide resin, polyamide resin, siloxane resin, acrylic resin, epoxy resin, and the like. These may be used alone or in combination with each other.

The light emitting element OLED may be formed within the opening defined by the pixel defining layer HPDL. Specifically, the pixel electrode PXL, the light emitting layer EML, and the common electrode CAT may be sequentially formed in the opening defined by the pixel defining layer HPDL.

The pixel electrode PXL may be formed of the metal, the alloy, the metal nitride, the conductive metal oxide, the transparent conductive material, and the like. These may be used alone or in combination with each other.

The light emitting layer EML may be formed of the material for emitting light. For example, the light emitting layer EML may be formed of the organic light emitting material or the inorganic light emitting material.

The common electrode CAT may be formed of the metal, the alloy, the metal nitride, the conductive metal oxide, the transparent conductive material, and the like. These may be used alone or in combination with each other.

Accordingly, the display device DD including the shielding pattern BVIA1 may be formed. The shielding pattern BVIA1 may cover the third transistor T3, the fourth transistor T4, the first hold capacitor N3 HOLD, and the second hold capacitor N4 HOLD. Accordingly, the third transistor T3, the fourth transistor T4, the first hold capacitor N3 HOLD, and the second hold capacitor N4 HOLD may be shielded from the light. In addition, the shielding pattern BVIA1 may be covered by the first via insulating layer VIA1. Accordingly, the shielding pattern BVIA1 may not be damaged in the subsequent process (e.g., the via hole formation process).

Figure 25:
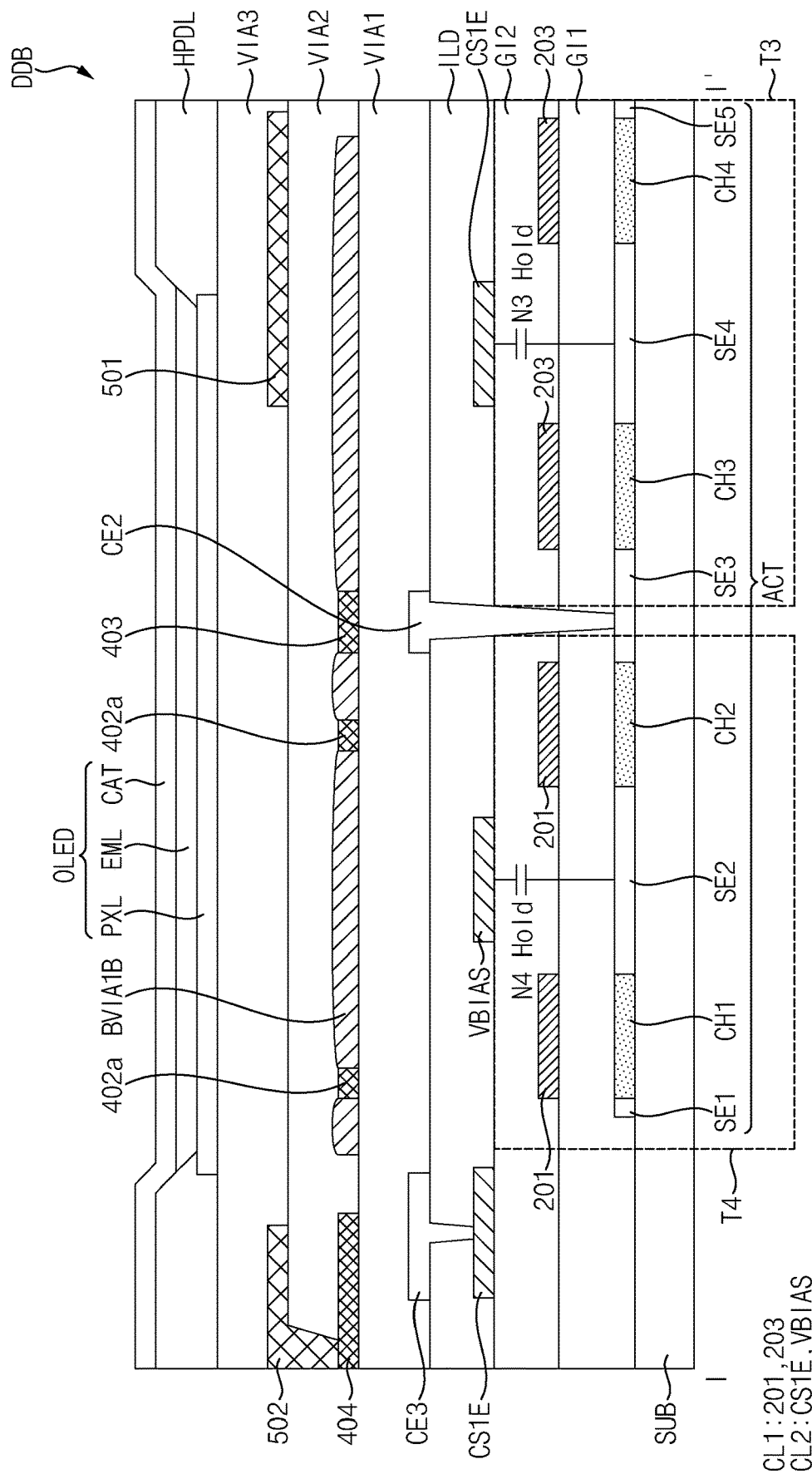
FIGS. 25 and 26 are cross-sectional views illustrating another embodiment of the display device of FIG. 1.
Figure 26:
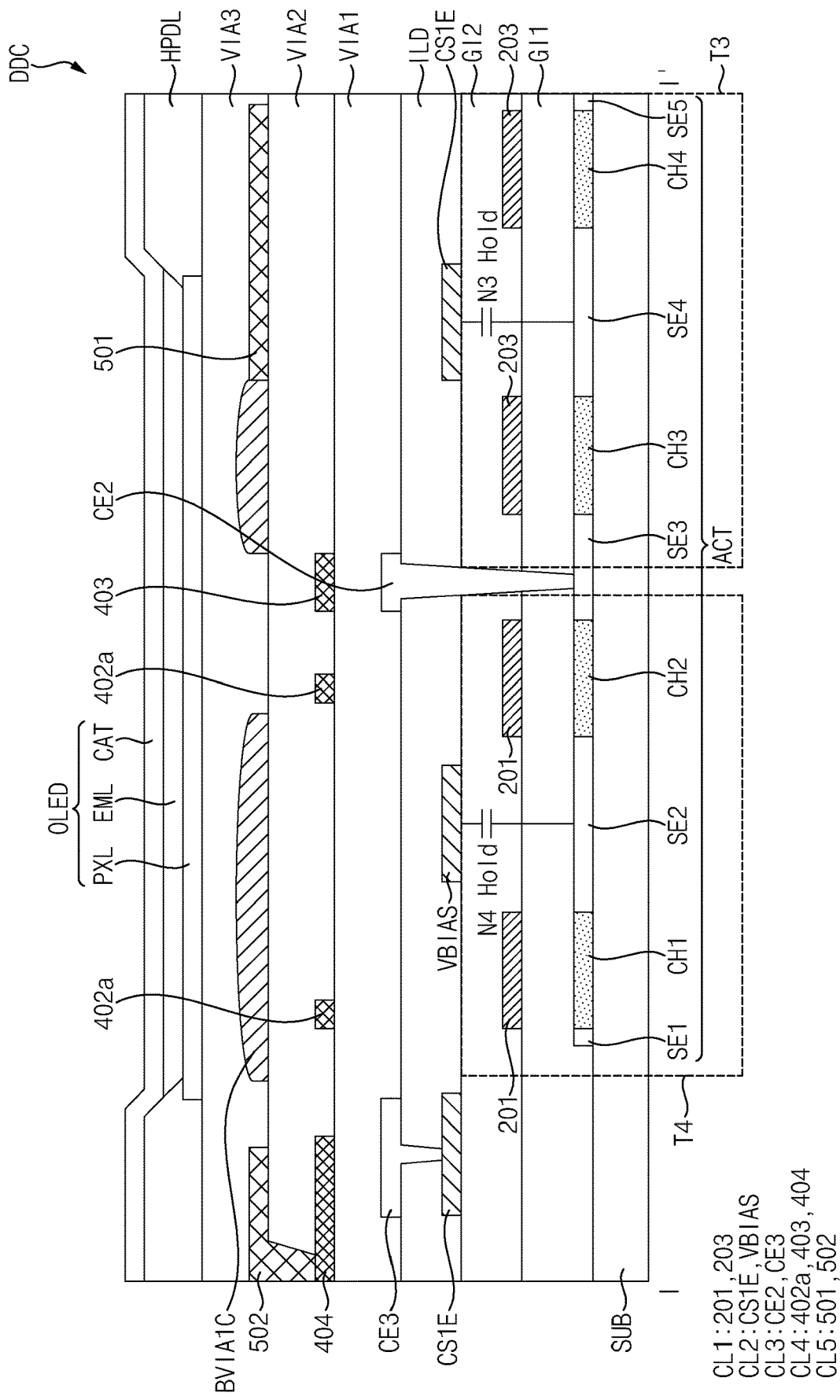

FIGS. 25 and 26 are cross-sectional views illustrating another embodiment of the display device of FIG. 1.

For example, FIG. 25 may differ from FIG. 24 in that the shielding pattern BVIA1B is formed on the first via insulating layer VIA1, and FIG. 26 may differ from FIG. 24 in that a shielding pattern BVIA1C is formed on the second via insulating layer VIA2.

As shown in FIG. 25, a display device DDB may be configured such that the shielding pattern BVIA1B is disposed on the first via insulating layer VIA1. In this case, the shielding pattern BVIA1B may overlap the first gate electrodes, the second gate electrodes, the first storage electrode, and the second storage electrode, and may not overlap via holes defined in the second via insulating layer VIA2.

As shown in FIG. 26, a display device DDC may be configured such that the shielding pattern BVIA1C is disposed on the second via insulating layer VIA2. In this case, the shielding pattern BVIA1C may overlap the first gate electrodes, the second gate electrodes, the first storage electrode, and the second storage electrode, and may not overlap via holes defined in the third via insulating layer VIA3.

According to embodiments of the disclosure, the display devices DD, DDB, or DDC may include the shielding patterns BVIA1, BVIA1B, or BVIA1C. The shielding patterns BVIA1, BVIA1B, or BVIA1C may be covered by the via insulating layers (e.g., the first via insulating layer VIA1, the second via insulating layer VIA2, or the third via insulating layer VIA3). Accordingly, the shielding patterns BVIA1, BVIA1B, or BVIA1C may not be damaged in the subsequent process. Accordingly, low-frequency driving characteristics of the display devices DD, DDB, or DDC may be improved, and the display devices DD, DDB, and DDC may have a robust structure.

Figure 27:
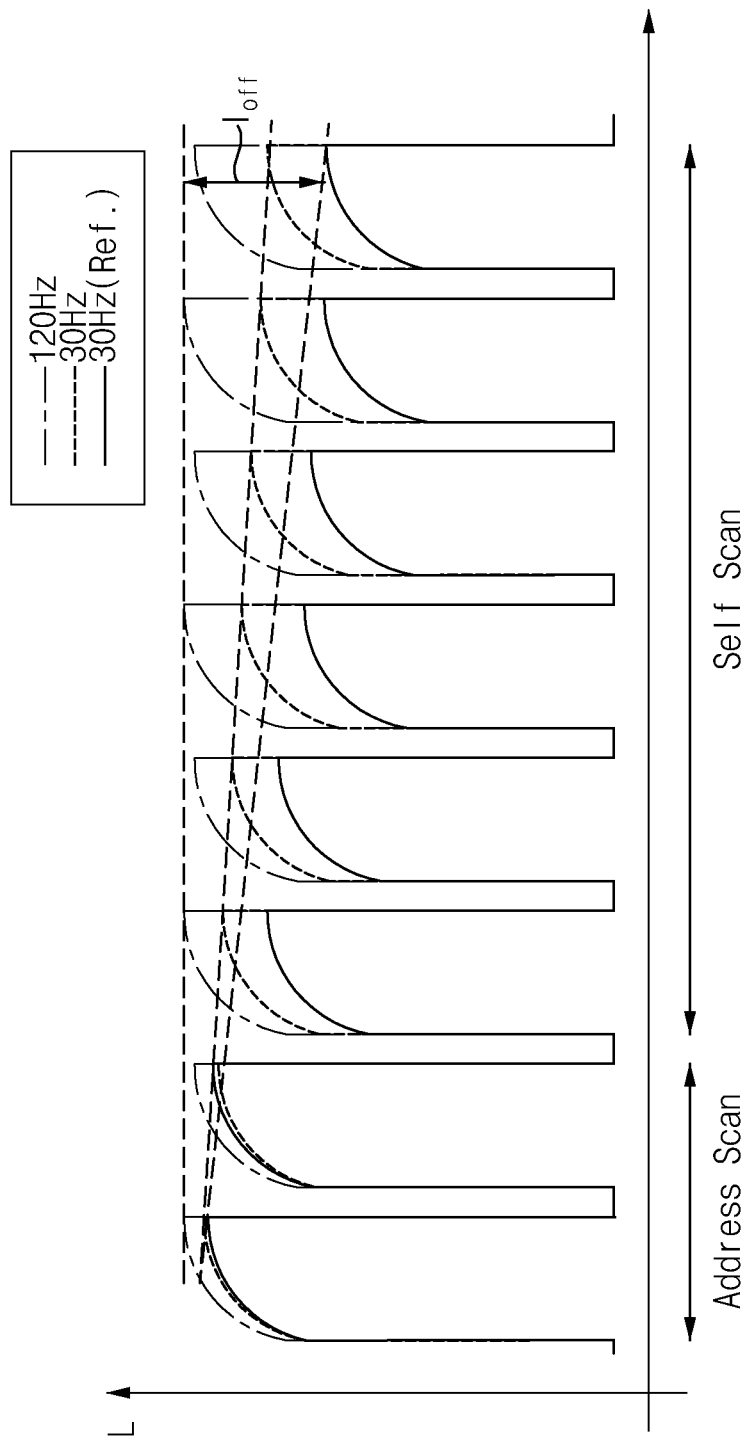
FIG. 27 is a view illustrating an effect of improving the low-frequency driving characteristics of the display device according to embodiments of the disclosure.

FIG. 27 is a view illustrating an effect of improving the low-frequency driving characteristics of the display device according to embodiments of the disclosure. Specifically, FIG. 27 shows a light waveform as a function of frequency.

A display device according to a comparative embodiment may not include the shielding pattern (e.g., the shielding pattern BVIA1 of FIG. 24, the shielding pattern BVIA1B of FIG. 25, or the shielding pattern BVIA1C of FIG. 26). In a case of the display device according to the comparative embodiment, an amount of a leakage current Ioff may be significantly increased in a self-scan period during low-frequency driving (solid line) as compared with high-frequency driving (dash-single dotted line). Accordingly, the display device according to the comparative embodiment may have a luminance that is reduced in the self-scan period.

The display devices DD, DDB, and DDC according to the embodiments of the disclosure may include the shielding patterns BVIA1, BVIA1B, or BVIA1C. The shielding patterns BVIA1, BVIA1B, or BVIA1C may cover the third transistor T3, the fourth transistor T4, the first hold capacitor N3 HOLD, and the second hold capacitor N4 HOLD. Accordingly, when the display devices DD, DDB, or DDC are driven at the low frequency (dotted line), the amount of the leakage current Ioff in the self-scan period may be reduced as compared with the display device according to the comparative embodiment. Accordingly, the luminance reduction of the display devices DD, DDB, or DDC in the self-scan period may be improved.

The embodiments of the disclosure may be applied to a computer, a notebook, a cell phone, a smart phone, a smart pad, a PMP, a PDA, a MP3 player, and the like.

Although the display device and the method of manufacturing the same according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
a substrate;
an active pattern disposed on the substrate and including a first region, a second region, and a first channel region;
a first conductive layer disposed on the active pattern and including a first gate electrode overlapping the first channel region;
a second conductive layer disposed on the first conductive layer and including a first storage electrode overlapping the second region;
a shielding pattern disposed on the second conductive layer, overlapping the first gate electrode and the first storage electrode, and including a black material; and
a light emitting element disposed on the shielding pattern.

2. The display device of claim 1, further comprising:
an interlayer insulating layer disposed on the second conductive layer; and
a first via insulating layer disposed between the interlayer insulating layer and the light emitting element.

3. The display device of claim 2, wherein the first via insulating layer covers the shielding pattern.

4. The display device of claim 3, further comprising a via hole formed through the first via insulating layer, and
wherein the shielding pattern includes:
a first shielding pattern disposed adjacent to the via hole; and
a second shielding pattern disposed to be spaced apart from the first shielding pattern and having a shape that is different from a shape of the first shielding pattern in a plan view.

5. The display device of claim 1, further comprising:
an interlayer insulating layer disposed on the second conductive layer;
a first via insulating layer disposed on the interlayer insulating layer; and
a second via insulating layer disposed between the first via insulating layer and the light emitting element,
wherein the second via insulating layer covers the shielding pattern.

6. The display device of claim 5, further comprising a via hole formed through the second via insulating layer, and
wherein the shielding pattern includes:
a first shielding pattern disposed adjacent to the via hole; and
a second shielding pattern disposed to be spaced apart from the first shielding pattern and having a shape that is different from a shape of the first shielding pattern in a plan view.

7. The display device of claim 1, further comprising:
an interlayer insulating layer disposed on the second conductive layer;
a first via insulating layer disposed on the interlayer insulating layer;
a second via insulating layer disposed on the first via insulating layer; and
a third via insulating layer disposed between the second via insulating layer and the light emitting element,
wherein the third via insulating layer covers the shielding pattern.

8. The display device of claim 7, further comprising a via hole formed through the third via insulating layer, and
wherein the shielding pattern includes:
a first shielding pattern disposed adjacent to the via hole; and
a second shielding pattern disposed to be spaced apart from the first shielding pattern and having a shape that is different from a shape of the first shielding pattern in a plan view.

9. The display device of claim 1, wherein the first gate electrode constitute a driving initialization transistor together with the first region, the second region, and the first channel region of the active pattern.

10. The display device of claim 1, wherein the active pattern further includes a fourth region, a fifth region, a third channel region, and a fourth channel region.

11. The display device of claim 10, wherein,
the first conductive layer further includes second gate electrodes disposed on the active pattern and overlapping the third channel region and the fourth channel region, respectively, and
the shielding pattern overlaps the second gate electrodes.

12. The display device of claim 11, wherein,
the second conductive layer further includes a second storage electrode disposed on the first conductive layer and overlapping the fourth region, and
the shielding pattern overlaps the second storage electrode.

13. The display device of claim 12, wherein the second gate electrodes constitute a diode transistor together with the third region, the fourth region, the fifth region, the third channel region, and the fourth channel region of the active pattern.

14. A display device comprising:
a substrate;
an active pattern disposed on the substrate and including a first region, a second region, a third region, a fourth region, a fifth region, a first channel region, a second channel region, a third channel region, and a fourth channel region;
a first conductive layer disposed on the active pattern and including first gate electrodes overlapping the first channel region and the second channel region, respectively, and second gate electrodes overlapping the third channel region and the fourth channel region, respectively;
a second conductive layer disposed on the first conductive layer, and including a first storage electrode overlapping the second region and a second storage electrode overlapping the fourth region;
an electrode pattern disposed on the second conductive layer and connected to the third region of the active pattern;
a shielding pattern disposed on the second conductive layer, overlapping the first gate electrodes, the second gate electrodes, the first storage electrode, and the second storage electrode, and including a black material; and
a light emitting element disposed on the shielding pattern.

15. The display device of claim 14, further comprising:
an interlayer insulating layer disposed on the second conductive layer; and
a first via insulating layer disposed between the interlayer insulating layer and the light emitting element.

16. The display device of claim 15, wherein the first via insulating layer covers the shielding pattern and the electrode pattern, and include a via hole formed through the first via insulating layer, and
wherein the shielding pattern includes:
a first shielding pattern disposed adjacent to the via hole; and
a second shielding pattern disposed to be spaced apart from the first shielding pattern and having a shape that is different from a shape of the first shielding pattern in a plan view.

17. The display device of claim 15, further comprising:
a second via insulating layer disposed between the first via insulating layer and the light emitting element,
wherein the second via insulating layer covers the shielding pattern and includes a via hole formed through the second via insulating layer, and
wherein the shielding pattern includes:
a first shielding pattern disposed adjacent to the via hole; and
a second shielding pattern disposed to be spaced apart from the first shielding pattern and having a shape that is different from a shape of the first shielding pattern in a plan view.

18. The display device of claim 15, further comprising:
a second via insulating layer disposed on the first via insulating layer; and
a third via insulating layer disposed between the second via insulating layer and the light emitting element,
wherein the third via insulating layer covers the shielding pattern, and includes a via hole formed through the third via insulating layer, and
wherein the shielding pattern includes:
a first shielding pattern disposed adjacent to the via hole; and
a second shielding pattern disposed to be spaced apart from the first shielding pattern and having a shape that is different from a shape of the first shielding pattern in a plan view.

19. The display device of claim 14, wherein the first gate electrodes constitute a driving initialization transistor together with the first region, the second region, the third region, the first channel region, and the second channel region of the active pattern.

20. The display device of claim 14, wherein the second gate electrodes constitute a diode transistor together with the third region, the fourth region, the fifth region, the third channel region, and the fourth channel region of the active pattern.

* * * * *